United States Patent [19]
Watanabe

[11] Patent Number: 5,386,391
[45] Date of Patent: Jan. 31, 1995

[54] SEMICONDUCTOR MEMORY DEVICE, OPERATING SYNCHRONOUSLY WITH A CLOCK SIGNAL

[75] Inventor: Yuji Watanabe, Kawasaki, Japan

[73] Assignee: Kabushiki Kaisha Toshiba, Kawasaki, Japan

[21] Appl. No.: 68,705

[22] Filed: May 28, 1993

[30] Foreign Application Priority Data

May 29, 1992 [JP] Japan .................................. 4-163953

[51] Int. Cl.⁶ .......................................... G11C 11/408
[52] U.S. Cl. ................................. 365/233; 365/233.5
[58] Field of Search ............................. 365/233, 233.5

[56] References Cited

U.S. PATENT DOCUMENTS 5,155,705 10/1992 Goto et al. ........................ 365/233
5,274,596 12/1993 Watanabe ........................ 365/233

Primary Examiner—Eugene R. LaRoche
Assistant Examiner—F. Niranjan
Attorney, Agent, or Firm—Foley & Lardner

[57] ABSTRACT

The semiconductor memory device is improved so as to be simplified and to cope with a high speed CPU by allowing the CPU and the memory device to be controllable by only a single clock. The address control sections are operated on the basis of a monoperiod clock signal CLK and a group of control signals. The column address is applied to a plurality of divided memory cell arrays, respectively, so that the memory cell arrays can be interleaved with each other. The input and output buffers controlled by the input and output control section 1 are operated in pipeline processing, to increase the access speed of data read from or written in the memory cell arrays 17 and 18.

33 Claims, 33 Drawing Sheets

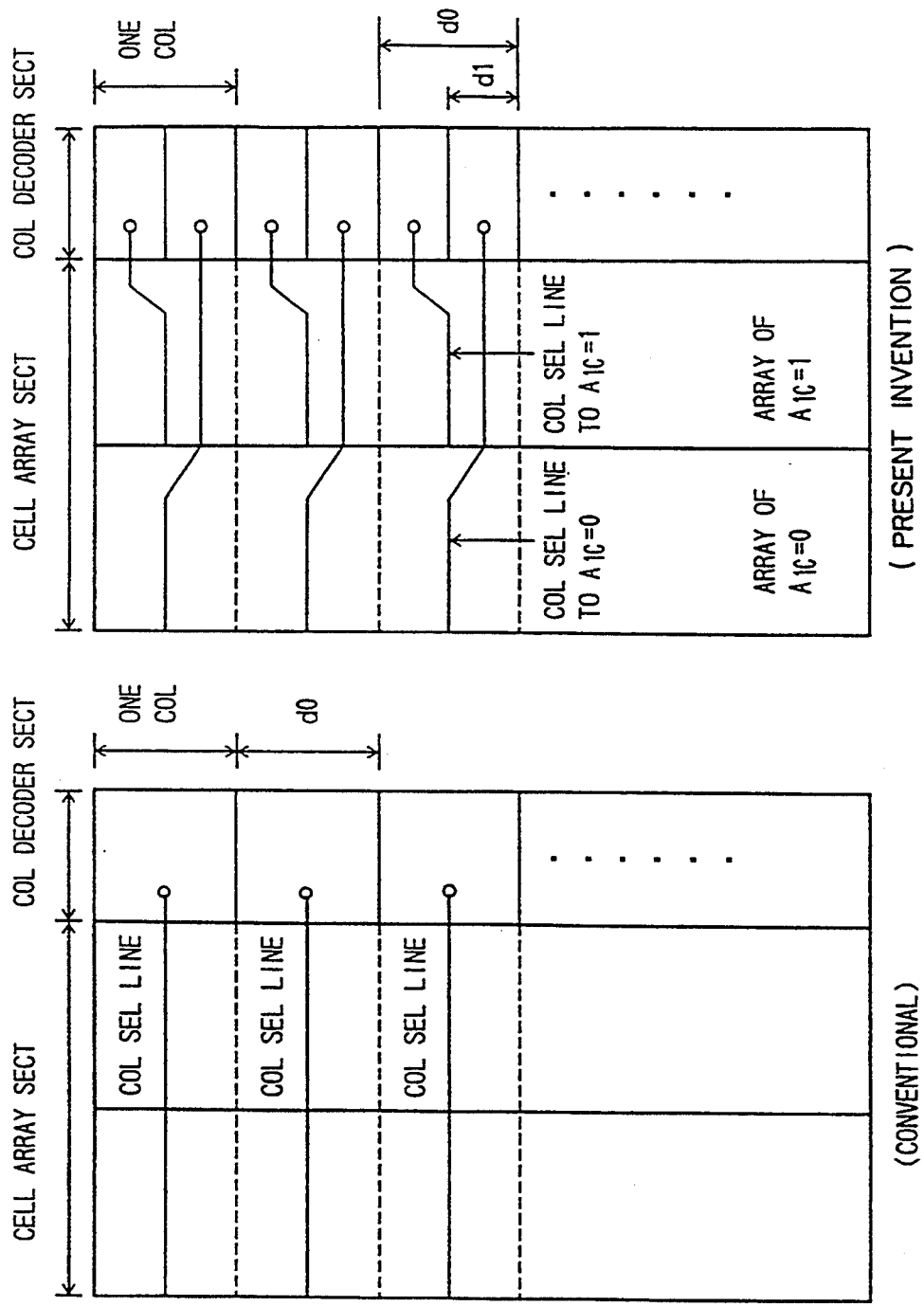
F I G. 8

(TABLE 1)

| ADDR SEL CKT | TAP SET SECT ADDR INPUT (A0C, A1C) | | | | | |
|---|---|---|---|---|---|---|
| | TYPE A | | TYPE B | | TYPE C | |
| | READ | WRITE | READ | WRITE | READ | WRITE |
| SY00 | 00 | 00 | 11 | 00 | 10 | 00 |
| SY01 | 01 | 01 | 00 | 01 | 11 | 01 |
| SY10 | 10 | 10 | 01 | 10 | 00 | 10 |
| SY11 | 11 | 11 | 10 | 11 | 01 | 11 |

F I G. 10

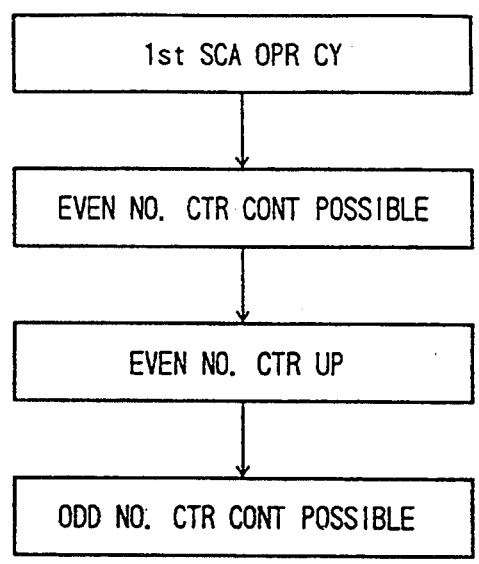
F I G. 1 4

| NO | MODE / TIMING | READ MODE | WRITE MODE | |
|---|---|---|---|---|
| 1 | AFT CE ↗ TO RWL ↗ | NON-OPR | NON-OPR | ACTIVE PRE CHG BY CE |
| 2 | AFT CE ↘ | NON-OPR FR 1st CLK | NON-OPR FR 2nd CLK (OPR TO 1st CLK) | |
| 3 | AFT RWL ↗ | OPR FR 1st CLK | OPR FR 2nd CLK (NON-OPR TO 1st CLK) | AFT RWL |
| 4 | AFT CM ↗ | NON-OPR FR 1st CLK | NON-OPR FROM 2nd CLK (OPR TO 1st CLK) | CM |
| 5 | AFT CM ↘ | OPR FR 1st CLK | OPR FR 2nd CLK (NON-OPR FOR 1st CLK) | |

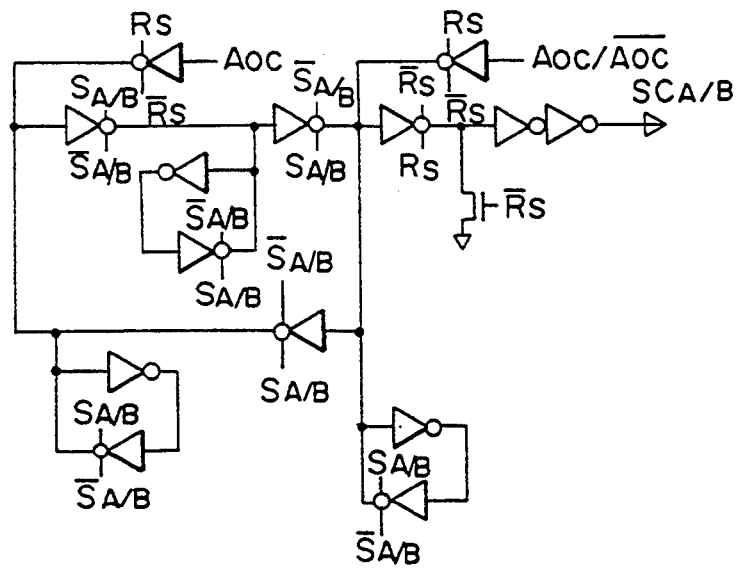
F I G. 18
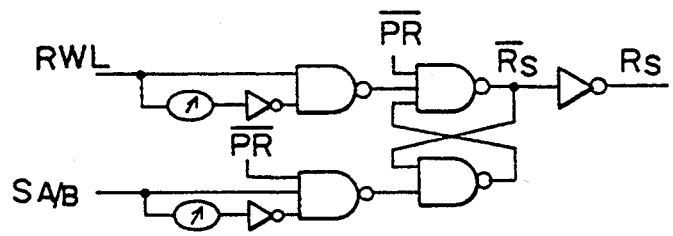
F I G. 19

| ITEM NO. | TIMING | OPERATION |
|---|---|---|
| 1 | AFT RWL ↗ | CHG SCA/B ↘ & DET MULT-P CKT ON TAP ADDR |
| 2 | 1st S ↗ AFT RWL ↗ | REL SCA/B=L(fix) TO DECIDE SCA/B BY S-PULSE |
| 3 | PRECHG | CHG SCA/B ↘ & KEEP L(fix) TO 1st S ↗ OF NEXT CY |

F I G. 2 0

| ITEM NO. | TAP ADDRESS | 1st CYCLE |
|---|---|---|
| 1 | $A_0 C=0$ | SCB |
| 2 | $A_0 C=1$ | SCA |

F I G. 2 1

| ITEM NO. | TIMING | OPERATION |
|---|---|---|
| 1 | AFT SCA/B ↗ | · OUTPUT L-PULSE WITH SP PULSE W<br>· L-PULSE IF SCA/B ↘ |
| 2 | AT PRECHG | · CHG TO H(fix) BY PRECHG SIG |
| 3 | PULSE W | · REQ TO SECURE CTR COUNT-UP & TO CHG QACT SIG TO L |
F I G. 23
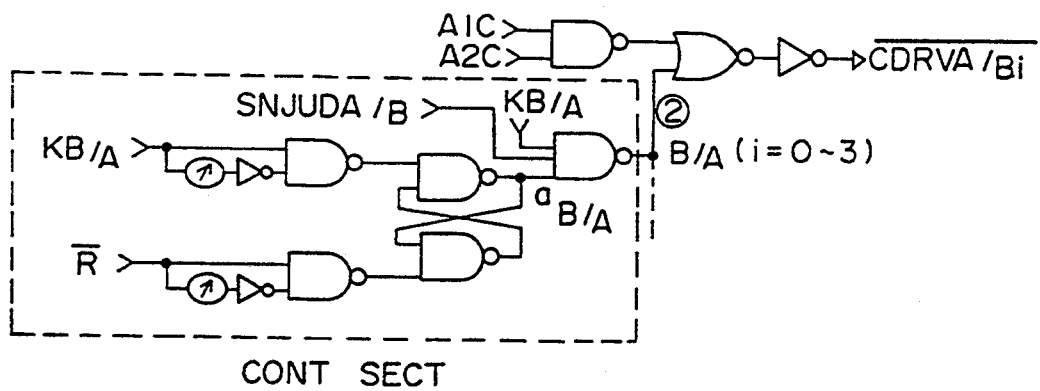
F I G. 24

| ITEM NO. | TIMING | OPERATION |
|---|---|---|
| 1 | AT K↑ | • CHG $\overline{CDRV}$ SEL BY ADDR TO L |
| 2 | AT K↓ | • CHG $\overline{CDRV}$ ↑ |
| 3 | AFT CE↑ | • $\overline{CDRV}$=H(fix) TO 1st K↓ AFT CE↑. NON-OPR |
| 4 | AFT RWL↑ | • CHG & KEEP $\overline{CDRV}$↑ TO 1st K↓<br>• DISABLE $\overline{CDRV}$ ↓ |
| 5 | 1st K↓ AFT RWL | • ENABLE $\overline{CDRV}$ ↓ |
| 6 | IN PRECHG | • CHG $\overline{CDRV}$↑ TO H(fix) |

| ITEM NO. | TIMING | OPERATION |
|---|---|---|
| 1 | AT K ↗ | CHG OSEB(A)↗ DELAYED AFT KA(B)↗ |
| 2 | AT K ↘ | CHG OSEB(A)↘ AT KA(B)↘ TO RESET |
| 3 | IN PRE CHG | OSEA/B=L(fix) |
| 4 | AT RWL ↗ | OSEA/B↘ TO RESET |
| 5 | CLK CY AFT RWL ↗ | NO INFLUENCE TO OSEA/B |
| 6 | TO 1st K AFT ACTIVE | OSEA/B=L(fix) |

FIG. 27

(ODRV)

| ITEM NO. | TIMING | OPERATION |
|---|---|---|
| 1 | AT K ↗ | CHG ODRVB(A)↗ AT KA(B)↗ |
| 2 | AT K ↘ | CHG ODRVB(A)↘ AT KA(B)↘ |
| 3 | IN PRE CHG | L(fix) |
| 4 | AT RWL ↗ | ODRVA/B↘ TO RESET |
| 5 | CLK CY AFT RWL ↗ | NO INFLUENCE TO OPR OF ODRV |
| 6 | TO 1st K AFT ACTIVE | ODRVA/B=L(fix) |

FIG. 28

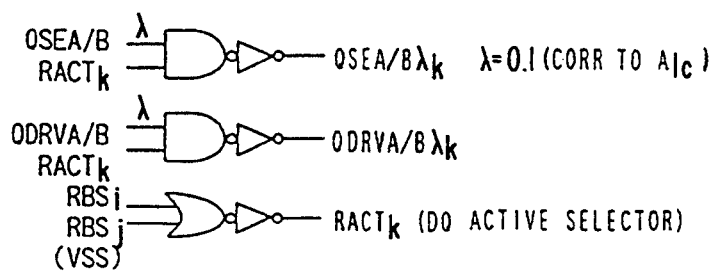
FIG. 29
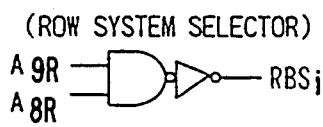
(ROW SYSTEM SELECTOR)
FIG. 30
(OSEn)
| NO. | TIMING | OPERATION |
|---|---|---|
| 1 | OSE ↗ | · ONLY CKT DECODED BY (A9R, A8R, AIC) CHG OSEn ↗ |
| 2 | OSE ↘ | · CHG ALL OSEn ↘ |
FIG. 31
(ODRVn)
| NO. | TIMING | OPERATION |
|---|---|---|
| 1 | O DRV ↗ | · ONLY CKT DECODED BY (A9R, A8R, AIC) CHG ODRVn ↗ |
| 2 | O DRV ↘ | · CHG ALL ODRVn ↘ |
FIG. 32

| CELL ARRAY BLOCK | ☒ | 0 | 1 | 2 | 3 | ☒ | (SUFFIX OF RBS) |
|---|---|---|---|---|---|---|---|
| $RBS_i$ INPUT | | 0 | 0 | 2 | 2 | VSS | |
| $RBS_j$ INPUT | | VSS | 1 | 1 | 3 | 3 | CORR TO DO LINE |
| $RACT_k$ | | 0 | 1 | 2 | 3 | 4 | |
FIG. 33
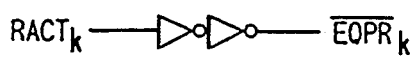
FIG. 34
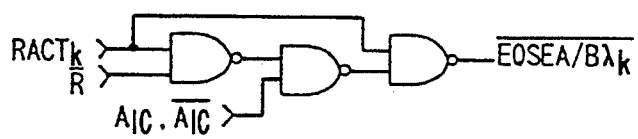
FIG. 35
| ITEM NO. | TIMING | OPERATION |
|---|---|---|
| 1 | IN ACTIVE | · EQ-OFF TO SEL ARRAY<br>· EQ-ON TO NON-SEL ARRAY |
| 2 | IN PRECHG | · EQ-ON TO ALL ARRAYS |
FIG. 36

| ITEM NO. | TIMING | OPERATION |
|---|---|---|
| 1 | IN ACTIVE CY | • ENABLE EQ TO SEL ARRAY<br>• DISABLE EQ TO NON-SEL ARRY |
| 2 | IN PRECHG | • DISABLE EQ TO ALL ARRAY |
| 3 | IN SER CY | • EQ DQ L SEL BY $A_{0C}$ $A_{1C}$ STOP EQ TO NON-SEL ARRY |
| 4 | AT RWL↑ | • EQ ALL ACTIVE DQ L |
| 5 | IN OP CY AFT RWL↑ | • ENABLE EQ TO ONLY DQ L SEL BY $A_{0C} \cdot A_{1C}$ |

| ITEM NO. | TIMING | OPERATION |
|---|---|---|
| 1 | AT RWL↑ | • DISABLE CTR-UP SIGS OF A&B SYS (NON-OPR TO SC) |
| 2 | AFT 1st SCA↑CY | • ENABLE CTR OF A-SYS |
| 3 | AFT 1st A-SYS CTR OPR | • ENABLE CTR OF B-SYS |

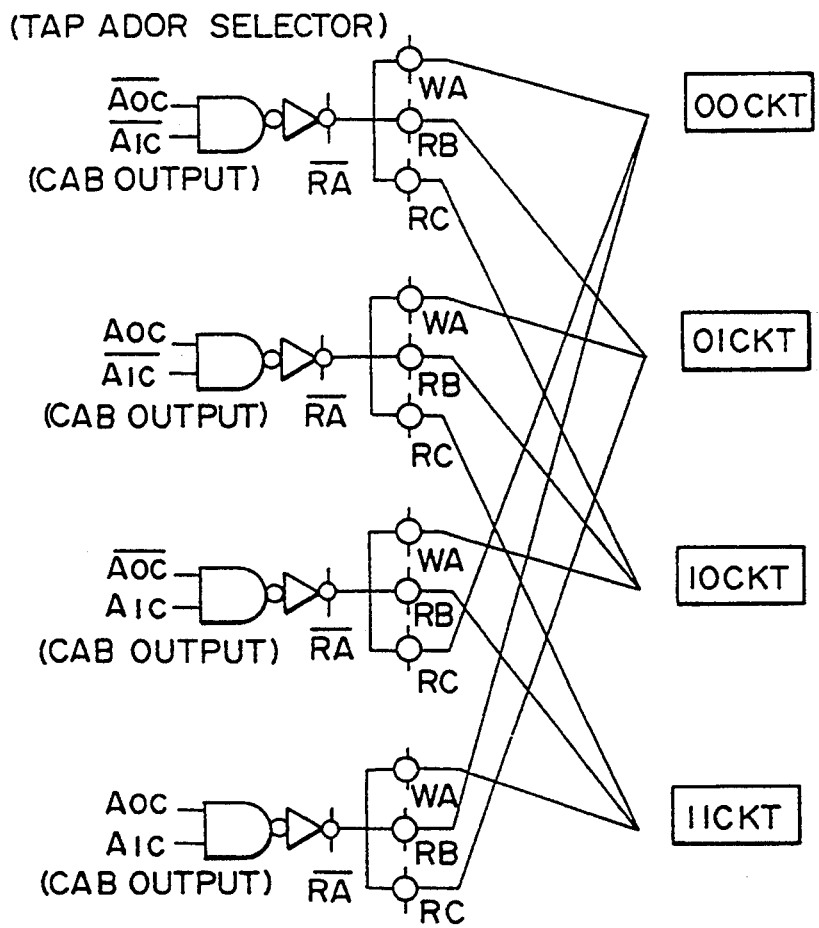
F I G. 41

∘WA ; H IN WR MODE & TYPE A

∘RB ; H IN RD MODE OF TYPE B

∘RC ; H IN RD MODE OF TYPE C (SELECTOR SELECTED IN RWL CY)

| TYPE / TAP | A(10n) | | B(20n) | | C(30n) | |
|---|---|---|---|---|---|---|
| | READ | WRITE | READ | WRITE | READ | WRITE |
| 00 | 00 | 00 | 01 | 00 | 10 | 00 |
| 01 | 01 | 01 | 10 | 01 | 11 | 01 |
| 10 | 10 | 10 | 11 | 10 | 00 | 10 |
| 11 | 11 | 11 | 00 | 11 | 01 | 11 |

- 4th CY TYPE A OUTPUT
- 3rd CY TYPE B OUTPUT
- 2nd CY TYPE C OUTPUT

FIG. 46

| ADDR SEL CKT | TAP SET SECT INPUT ($A_{0C}, A_{1C}$) | | | | | |
|---|---|---|---|---|---|---|
| | TYPE A | | TYPE B | | TYPE C | |
| | READ | WRITE | READ | WRITE | READ | WRITE |
| SY 00 | 00 | 00 | 11 | 00 | 10 | 00 |
| SY 01 | 01 | 01 | 00 | 01 | 11 | 01 |
| SY 10 | 10 | 10 | 01 | 10 | 00 | 10 |
| SY 11 | 11 | 11 | 10 | 11 | 01 | 11 |

FIG. 47

| ITEM NO. | TIMING | OPERATION |
|---|---|---|
| 1 | AT A↗ | • CHG RWD L CONNECTED TO OUT CKT TO NEXT ADDR (ONLY IN RD CY) |
| 2 | AFT RWL↗ | • ADDR CORR TO TAP ADDR ($A_{0C}, A_{1C}$) |
| 3 | IN PRECHG | • DISABLE OUTPUT |

FIG. 48

SEMICONDUCTOR MEMORY DEVICE, OPERATING SYNCHRONOUSLY WITH A CLOCK SIGNAL

FIELD OF THE INVENTION

The present invention relates to a semiconductor memory device, and more specifically to a semiconductor memory device suitable for high speed access in response to a simplified clock.

BACKGROUND OF THE INVENTION

Conventionally, a semiconductor memory device such as a DRAM has been widely used as a main memory for a personal computer or a mini-computer. The DRAM is generally controlled on the basis of various control signals such as CAS (column address select) signal obtained by processing a clock supplied to operate a CPU. In other words, the clock signal used for the CPU cannot be used as it is; that is, the clock for operating the CPU has been so far processed for controlling the memory device.

With the advance of the semiconductor technology, however, the operating frequency of the CPU has recently become higher than that of the DRAM. Therefore, in order to prevent the operating speed of the CPU from being affected by the operating speed of the DRAM, there has been required such complex memory control as using a plurality of assembled DRAMs interleaved therebetween.

In the case of a relatively small-scale system such as a mini-computer, work station, etc., however, when a number of memory devices are used under interleaved condition, there exists such a disadvantage that the control system of the memory device becomes complicated and therefore the system cost increases. In addition, since the operating frequency of the CPU has been increased up to 50 MHz and further to 100 MHz, it is necessary to construct the memory device hierarchically, thus raising a problem in that the control of the memory system becomes increasingly complicated, thereby increasing the system load.

SUMMARY OF THE INVENTION

With these problems in mind, it is the object of the present invention to provide a semiconductor memory device adaptable for a high operating speed CPU, by which the CPU and the DRAM can be both controlled on the basis of a single clock and further the control system can be simplified.

In the semiconductor memory device according to the present invention, the address control sections are operated on the basis of a monoperiod clock signal and a group of control signals. The column address is applied to a plurality of divided memory cell arrays, respectively, so that the memory cell arrays can be interleaved with each other. The input and output buffers controlled by the input and output control section are operated in pipeline processing, to increase the access speed of data read from or written in the memory cell arrays.

The semiconductor memory device of the present invention is simple in configuration and can well cope with a high speed CPU, by allowing the CPU and the memory device (e.g., DRAM) to be controllable by only a single clock.

BRIEF DESCRIPTION OF THE DRAWINGS

FIG. 8 is a table showing the physical positional relationship between the column select line and the address;

FIG. 10 is a table for assistance in explaining the tap address of the block shown in FIG. 9;

FIG. 14 is an illustration for assistance in explaining the counter operation of the memory device shown in FIG. 1;

FIG. 18 is a circuit diagram showing a circuit for generating the basic multiperiod signal SCA/B;

FIG. 19 is a circuit diagram showing a circuit for controlling the initialization;

FIG. 20 is a table for assistance in explaining the operation of the controlling circuit shown in FIG. 18;

FIG. 21 is a table for assistance in explaining the operation of the controlling circuit shown in FIG. 18;

FIG. 23 is a table for assistance in explaining the operation of the generating circuit shown in FIG. 22;

FIG. 24 is a circuit diagram showing a circuit for generating a column select line driver signal;

FIG. 27 is a table for assistance in explaining the operation of the generating circuit shown in FIG. 26;

FIG. 28 is a table for assistance in explaining the operation of the generating circuit shown in FIG. 26;

FIG. 29 is a circuit diagram showing a decode circuit;

FIG. 30 is a circuit diagram showing a decode circuit;

FIG. 31 is a table for assistance in explaining the operation of the decode circuits shown in FIGS. 29 and 30;

FIG. 32 is a table for assistance in explaining the operation of the decode circuits shown in FIGS. 29 and 30;

FIG. 33 is a table for assistance in explaining the operation of the decode circuits shown in FIGS. 29 and 30;

FIG. 34 is a circuit diagram showing a circuit for generating the DQ line equalize signal;

FIG. 35 is a circuit diagram showing another circuit for generating the DQ line equalize signal;

FIG. 36 is a table for assistance in explaining the operation of the generating circuit shown in FIG. 34;

FIG. 41 is a circuit diagram showing a tap address control circuit;

FIG. 46 is a table for assistance in explaining the operation of the circuits shown in FIGS. 40 and 41;

FIG. 47 is a table for assistance in explaining the operation of the circuits shown in FIGS. 40 and 41;

FIG. 48 is a table for assistance in explaining the operation of the circuits shown in FIGS. 40 and 41;

DETAILED DESCRIPTION OF THE PREFERRED EMBODIMENTS

The embodiments of the present invention will be described hereinbelow with reference to the attached drawings.

Prior to the detailed description of the embodiments of the present invention, the gist thereof will be summarized as follows: The object of the embodiments is to provide a high operating speed memory device usable with a high operating speed CPU, by which the CPU and the DRAM can be both controlled on the basis of a single clock and further the control system can be simplified. As the method of realizing the above-mentioned objective, (1) the column system is divided into two systems under interleaved condition, and further the respective divided systems are operated in pipeline processing mode. This is because when the column system is divided into four systems simply for instance, the address counters for four systems are inevitably needed, with the result that the chip size disadvantageously increases; (2) in the read mode, data are outputted to the input side of the output circuits in the first cycle, and then the data are acquired by the output circuits in the succeeding cycle; (3) in the write mode, data are acquired in the first cycle, and then data are written in the memory cell array in the succeeding cycle; (4) further in the write mode, when the inversion signal /OE of the output enable signal OE is used as the mask signal, the status of the inversion signal /OE is acquired and processed as data; (5) to improve the circuit operation margin, the divided column select lines are provided for the physically same column; and (6) to reduce supply voltage noise at high speed operation, the supply voltage lines are arranged in such a way that noise absorption capacitance can be easily provided between two supply voltages.

Figure 1:
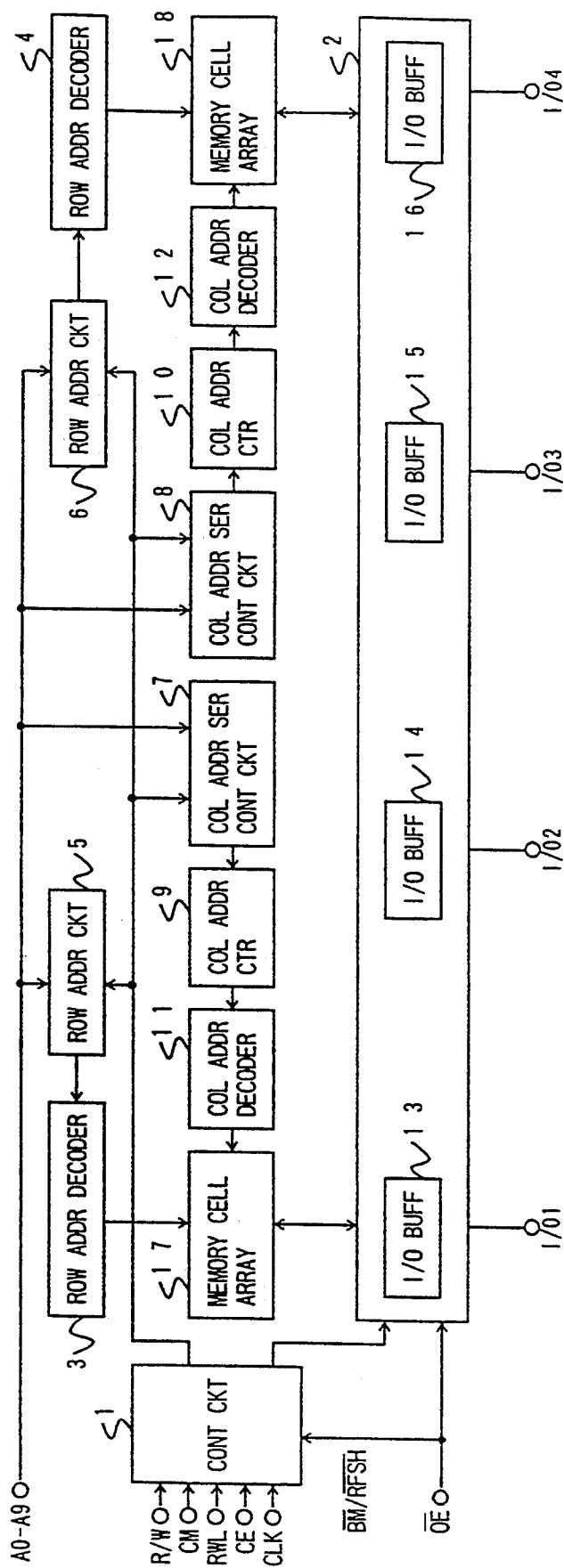
FIG. 1 is a block diagram showing an embodiment of the semiconductor memory device according to the present invention.

FIG. 1 is a block diagram showing an embodiment of the semiconductor memory device according to the present invention. In FIG. 1, the column system of the memory cell is divided into two of a memory cell array 17 and a memory cell array 18. On the other hand, a clock CLK which is also supplied to a CPU is supplied to a control circuit 1. In addition to the clock CLK, a chip enable signal CE, a read write latch signal RWL, a clock mask signal CM, and a read/write status signal R/W are inputted from the CPU to the control circuit 1. Further, an address A0 to A9 including a row address and a column address, and an inversion signal of an output enable signal OE are both inputted from the CPU to the column system of the memory cell. The output enable signal OE is inputted to the control circuit 1 as an inversion signal of a signal BM and/or an inversion signal of a refresh signal RFSH. Two row address circuits 5 and 6 are both operative in response to the control signal applied from the control circuit 1. The row address circuit 5 or 6 acquires a row address from the address A0 to A9 and further controls the row address of the memory cell array 17 or 18, respectively. A row address decoder 3 or 4 decodes the row address applied from the row address circuit 5 or 6, and designates the row address of the memory cell array 17 or 18, respectively. On the other hand, a column address serial control circuit 7 or 8 is operative in response to the control signal applied from the control circuit 1, and acquires a column address from the address A0 to A9 and controls the column address of the memory cell array 17 or 18, respectively. A column address counter 9 or 10 shifts the column address forward in sequence by determining the column address acquired by a column address serial control circuit 7 or 8 as the head address, respectively. A column address decoder 11 or 12 decodes the column address generated by the column address counter 9 or 10 and designates the column address of the memory cell array 17 or 18, respectively. Data are inputted and outputted via an input and output circuit 2 to and from the cell designated by the row address and the column address of the memory cell array 17 or 18. The input and output circuit 2 is provided with input and output buffers 13, 14, 15 and 16 each for temporarily storing the input and output data, and connected to external circuits via input and output sections I/O1 to 4, respectively. Further, the inversion signal of the output enable signal OE and the control signals from the control circuit 1 are inputted to the input and output circuit 2.

Figure 2:
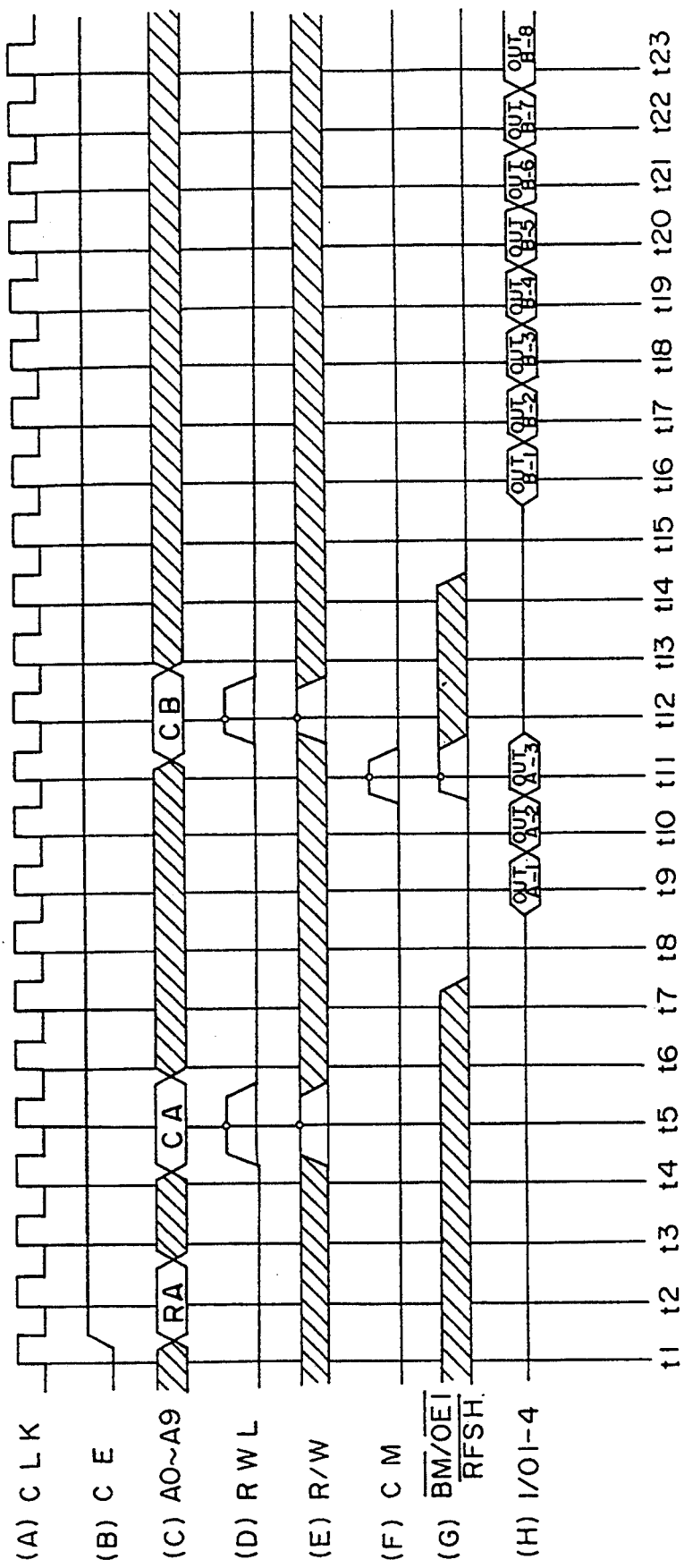
FIG. 2 is a timing chart for assistance in explaining the read & read cycle operation of the memory device shown in FIG. 1.
Figure 3:
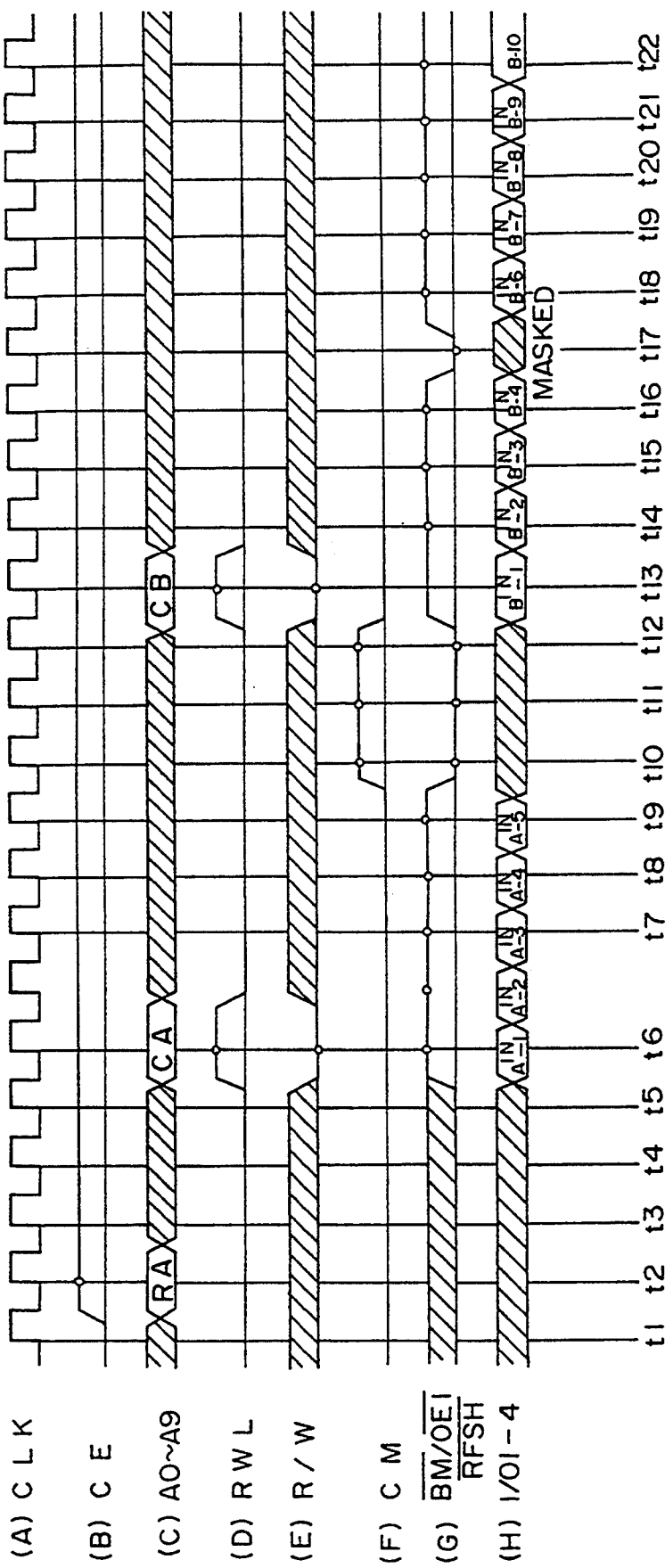
FIG. 3 is a timing chart for assistance in explaining the operation in the write & write cycle of the memory device shown in FIG. 1.
Figure 4:
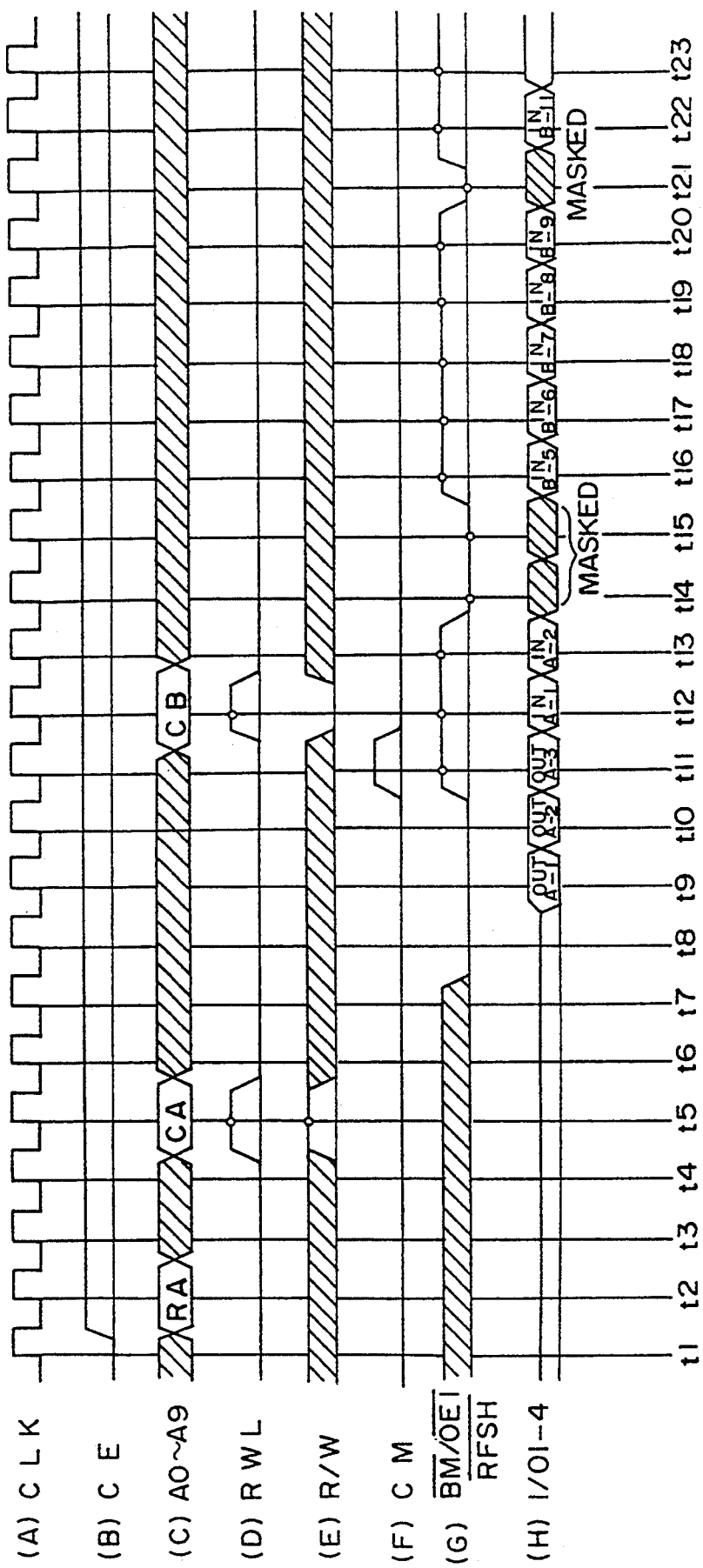
FIG. 4 is a timing chart for assistance in explaining the operation in read & write cycle of the memory device shown in FIG. 1.
Figure 5:
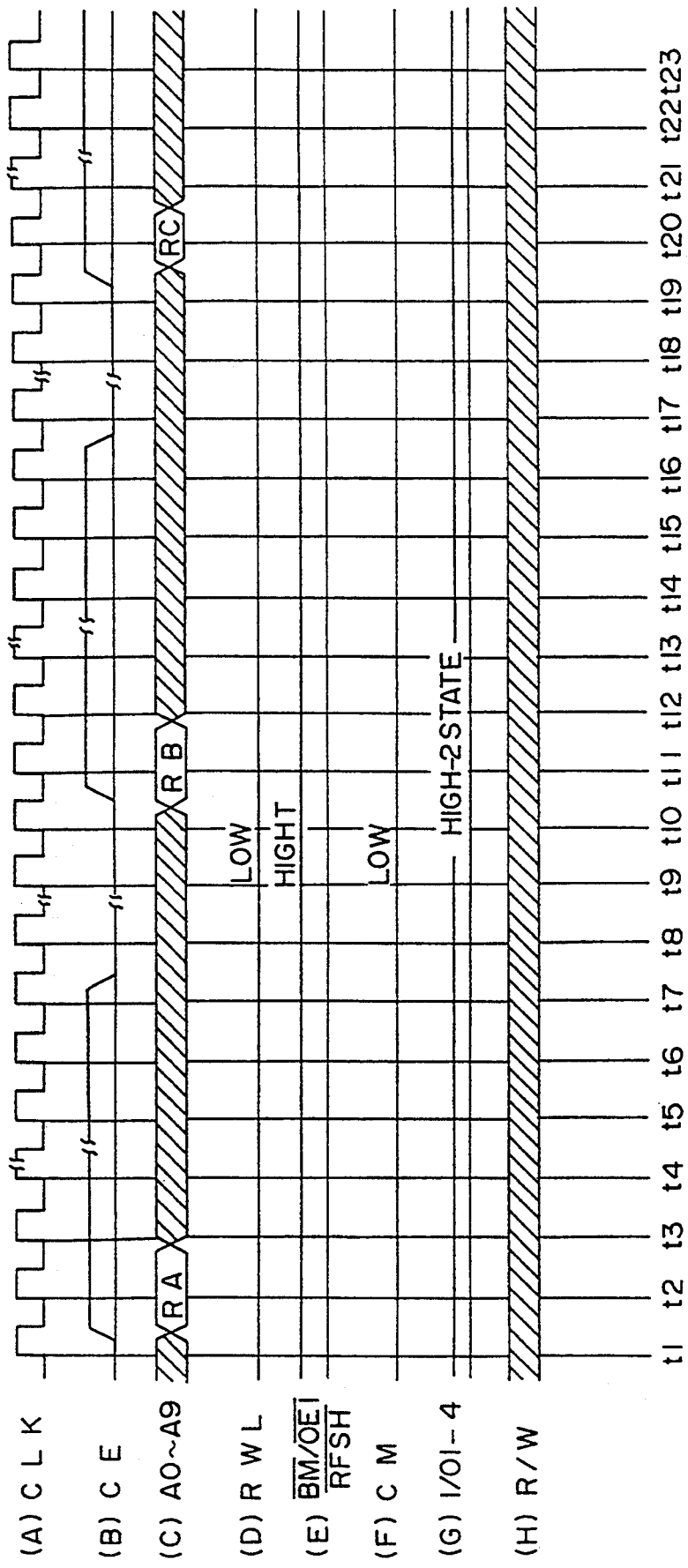
FIG. 5 is a timing chart for assistance in explaining the operation in the chip enable refresh cycle of the memory device shown in FIG. 1.
Figure 6:
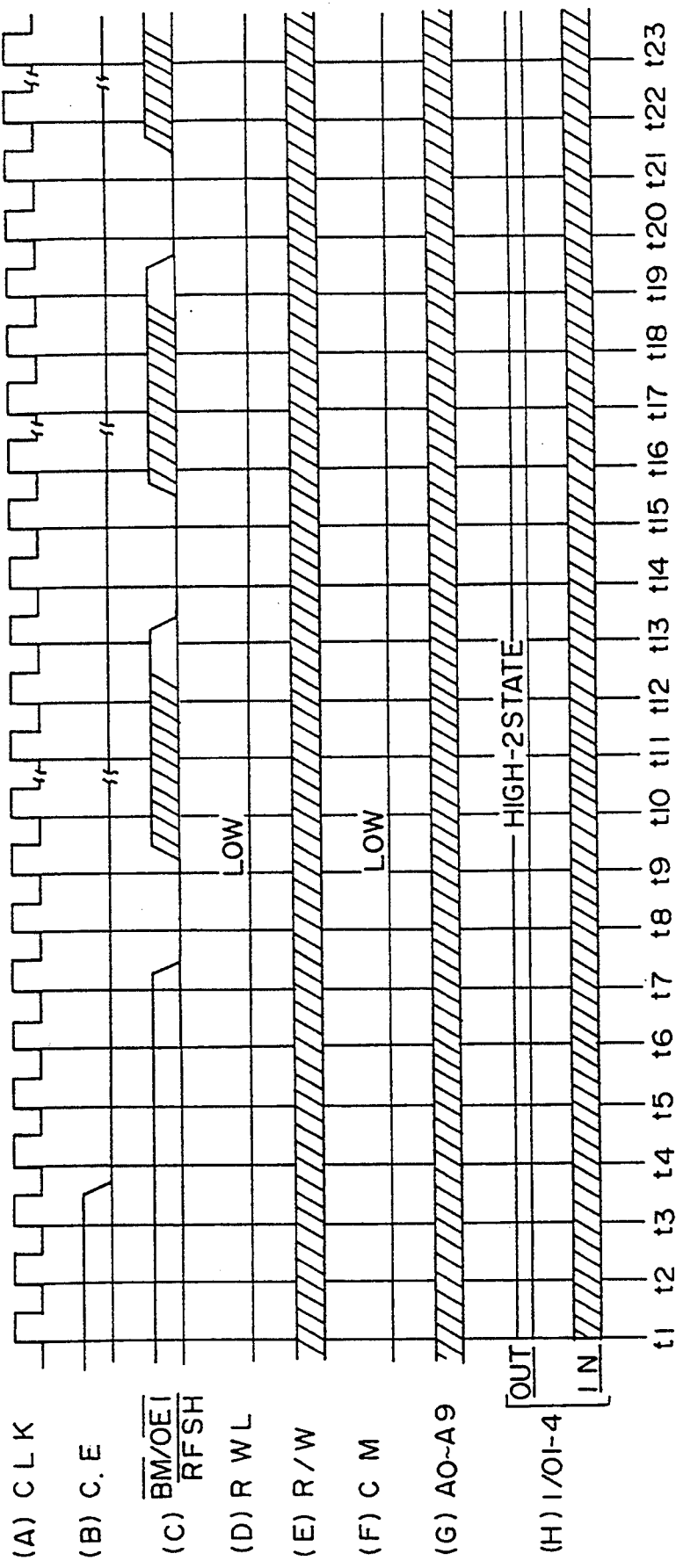
FIG. 6 is a timing chart for assistance in explaining the operation in the automatic refresh cycle of the memory device shown in FIG. 1.

The operation of the configuration as described above will be described with reference to the timing charts shown in FIGS. 2 to 6, in which FIG. 2 shows a read & read cycle; FIG. 3 shows a write & write cycle; FIG. 4 shows a read & write cycle; FIG. 5 shows a chip enable refresh cycle; and FIG. 6 shows an automatic refresh cycle. In FIGS. 2 to 4, (A) denotes the clock CLK; (B) denotes the chip enable signal CE; (C) denotes the address A0 to A9; (D) denotes the read/write latch signal RWL; (E) denotes the read/write status signal R/W; (F) denotes the clock mask signal CM; (G) denotes the inversion signals NBM/NOE/NRFSH of the signal BM, the output enable signal OE and/or the refresh signal RFSH; and (H) denotes the status of the input and output sections I/O1 to 4. In FIG. 5, (A) denotes the clock CLK; (B) denotes the chip enable signal CE; (C) denotes the address A0 to A9; (D) denotes the read/write latch signal RWL; (E) denotes the inversion signals NBM/NOE/NRFSH of the signal BM, the output enable signal OE and/or the refresh signal RFSH; (F) denotes the clock mask signal CM; (G) denotes the status of the input and output sections I/O1 to 4; and (H) denotes the read/write status signal R/W. Further, in FIG. 6, (A) denotes the clock CLK; (B) denotes the chip enable signal CE; (C) denotes the inversion signals NBM/NOE/NRFSH of the signal BM, the output enable signal OE and/or the refresh signal RFSH; (D) denoted the read and write latch signal RWL; (E) denotes the read/write status signal R/W; (F) denotes the clock mask signal CM; (G) denotes the address A0 to A9; and (H) denotes the status of the input and output sections I/O1 to 4, which is divided into output OUT and input IN.

In the read and read cycle shown by the timing chart in FIG. 2, at time t2 when the clock CLK first rises after the chip enable signal CE from the CPU (not shown) has changed from an L level to an H level between times t1 and t2, the row address circuit 5 or 6 acquires the row address RA from the address A0 to A9 under control of the control circuit 1. This row address RA designates the row address of the memory cell array 17 or 18 through the row address decoder 3 or 4. Thereafter, at time t5 when the clock CLK first rises after the read and write latch signal RWL has been changed from the L level to the H level between times t4 and t5, the control circuit 1 acquires and latches the read/write status signal R/W, and further the column address serial control circuit 7 or 8 acquires and latches the column address CA from the address A0 to A9. Thereafter, in the third cycle of the clock CLK between time t8 and t9, the column address counter 9 or 10 counts up the column address with the column address CA as the head address in synchronism with the rising edges of the clock CLK. Accordingly, the column of the memory cell array 17 or 18 is switched and selected in order, so that data are outputted in sequence to the input and output sections I/O1 to 4 via the input and output buffers 13, 14, 15 and 16 of the input and output circuit 2, respectively in the order of OUTA-1 to OUTA-3.

Successively, when the read and write latch signal RWL is changed again from the L level to the H level between time t11 and t12, at time t12 the control circuit 1 acquires a new read/write status signal R/W, and the column address serial control circuit 7 or 8 acquires the column address CB from the address A0 to A9 as the head address. As a result, thereafter, in the third cycle of the clock CLK between time t15 and t16, data are read out from the memory cell array 17 or 18 with the column address CA as the head address in synchronism with the rising edges of the clock CLK at time t16. The data are outputted in sequence to the input and output sections I/O1 to 4 via the input and output buffers 13, 14, 15 and 16 of the input and output circuit 2, respectively in the order of OUTB-1 to OUTB-8.

Further, in the cycle when the clock mask signal CM is at the H level, the column address serial control circuit 7 or 8 will not shift the column address forward in sequence and further the input and output circuit 2 is set to a high impedance output status under control of the control circuit 1. In the example shown in FIG. 2, the clock mask signal CM is outputted by one cycle between time t10 and t11. In this cycle, since the output of the input and output circuit 2 is kept at a high impedance, the column address is not shifted forward or does not advance. Further, at the first rise of the clock CLK after the inversion signal of the output enable signal OE has been changed to the L level, the precharge begins.

In the write and write cycle mode shown by the timing chart in FIG. 3, at time t2 when the clock CLK first rises after the chip enable signal CE has been changed from the L level to the H level between times t1 and t2, the row address circuit 5 or 6 acquires the row address RA from the address A0 to A9 under control of the control circuit 1. Thereafter, at time t6 when the clock CLK first rises after the read and write latch signal RWL has been changed from the L level to the H level between times t5 and t6, the control circuit 1 acquires and latches the read/write status signal R/W, and further the column address serial control circuit 7 or 8 acquires and latches the column address CA from the address A0 to A9. Further, in the case of the data write, in the first clock cycle after the read write latch signal RWL has been changed to the H level; that is, after time t6 data are inputted to the memory cell arrays 17 or 18 via the input and output sections I/O1 to 4 of the input and output circuit 2 in the order of the data INA-1 to INA-5 in sequence. In this connection, the data are written in sequence beginning from the head address given by the column address CA under the operation of the column address serial control circuit 7 or 8 and the column address counter 9 of 10.

Further, the head address of a new column address can be set to the column address serial control circuit 7 or 8, by changing the level of the read write latch signal RWL to the H level again. In this case, data can be inputted from this cycle. In the example shown in FIG. 3, the read write latch signal RWL changes from the L level to the H level between time t12 and time t13. In this case, at time t13 when the succeeding clock CLK rises, the column address serial control circuit 7 or 8 acquires and latches the column address CB from the address A0 to A9 in response to the read/write status signal R/W. Successively, in the first clock CLK cycle after the read write latch signal RWL has been changed to the H level; that is, from time t13, the data are inputted in sequence from the input and output sections I/O1 to 4 of the input and output circuit 2 to the memory cell array 17 or 18 in the order of INB-1 to INB-10.

Further, in the cycle when the clock mask signal CM changes to the H level; that is, from the time point between time t9 and time t10 to the time point between time t12 and time t13, the forward shift of the write address and the data input are both disabled under control of the control circuit 1. The data write in the succeeding column address begins from the succeeding cycle t13 between time t12 and time t13 during which the clock mask signal CM has been changed to the L level.

Further, the data write is effected in the cycle during which the inversion signal of the output enable signal OE is at the H level. In the cycle during which the inversion signal of the output enable signal OE is at the low level; that is, in the cycle from between time t16 and time t17 to between time t17 and time t18 in this example, although the address is advanced, the data input is disabled by the-operation of the control circuit 1 and the input and output circuit 2. Further, at the fourth rise of the clock CLK after the chip enable signal CE has been changed to the L level, the precharge begins.

In the read and write cycle shown by the timing chart in FIG. 4, the read cycle and the write cycle are combined with each other. The modes can be switched when the status of the read/write status signal R/W (acquired by the clock CLK after the read write latch signal RWL has been changed from the L level to the H level) is given to the control circuit 1. In other words, if the cycle is required to be changed to the read mode after the read write latch signal RWL has been changed to the H level, the read/write status signal R/W is changed to the H level. If required to be changed to the write mode, the read/write status signal R/W is changed to the L level. In the example shown, when the read write latch signal RWL changes to the H level between time t4 and time t5, the read/write status signal R/W also changes to the H level. Therefore, the cycle starting from the succeeding time t5 becomes the read mode, and the read/write status signal R/W changes to the L level when the read write latch signal RWL changes to the H level between time t11 and time t12. Therefore, the cycle starting from the time t12 becomes the write mode. Further, data are read or written in the read or write cycle, in the same way as described before with respect to the data read or write operation.

In this connection, it is possible to combine the read cycle and the write cycle appropriately. That is, the write and read cycle or other can be formed. Further, it is possible to form a cycle of other combinations.

The chip enable refresh cycle as shown by the timing chart in FIG. 5 corresponds in function to the row address select only refresh cycle of the general purpose DRAM. In this cycle, the inversion signal of the output enable signal OE is set to the H level, and then given to the control circuit 1 as the inversion signal of the signal BM and/or the refresh signal RFSH. When the first clock CLK rises after the chip enable signal CE has been changed from the L level to the H level (the times t2, t11, and t20 in the example shown in FIG. 5), the row address RC, RB or RC is acquired from the address A0 to A9 by the row address circuit 5 or 6 to implement the refresh operation. During this cycle, the read write latch signal RWL is fixed to the L level; the clock mask signal CM is fixed to the L level; and the input and output sections I/01 to 4 of the input and output circuit 2 are set to the high impedance status.

The automatic refresh cycle as shown by the timing chart in FIG. 6 starts when the inversion signal of the output enable signal OE is changed from the H level to the L level at the time between time t7 and time t8, after a predetermined precharge time has elapsed from the time point between time t3 and time t4 during which the chip enable signal CE has been changed from the H level to the L level. Thereafter, the one cycle ends when the inversion signal of the output enable signal OE has been fixed at the L level and then changed to and further fixed at the H level for a time more than a predetermined value. In this case, the row address to be refreshed is formed inside the row address circuit 5 or 6. The formed row address is shifted address by address, whenever the inversion signal of the output enable signal OE is changed to the L level so as to become the automatic refresh cycle between the succeeding time t13 and time t14 and between the succeeding time t19 and the time t20.

A practical configuration of the semiconductor memory device for implementing the above-mentioned operation will be described hereinbelow.

Figure 7:
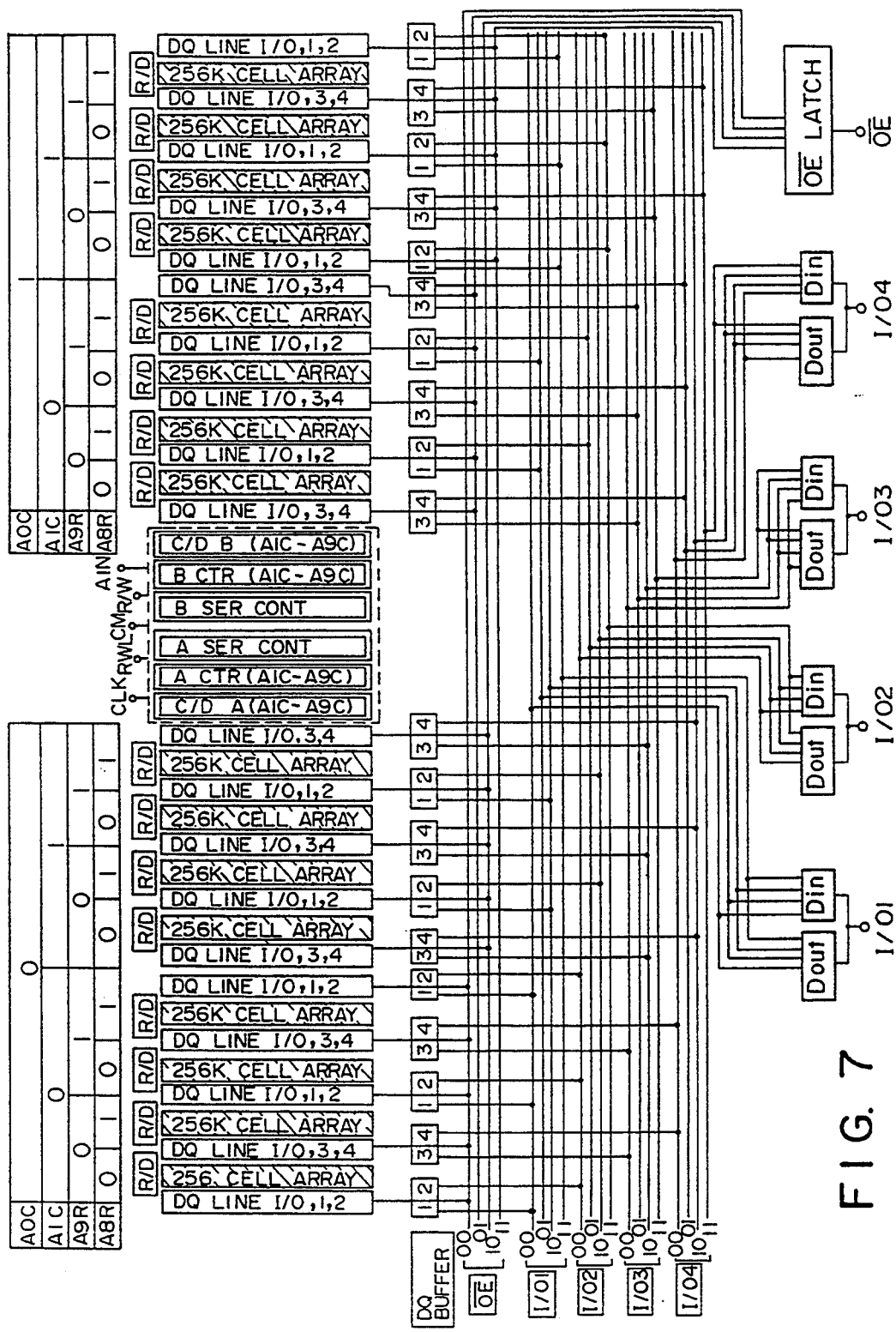
FIG. 7 is an address map obtained when the memory device according to the present invention is applied to a 4 Mbit DRAM.

FIG. 7 is an address map obtained when the semiconductor memory device is applied to a 4-Mbit DRAM composed of 4-units of 1MXs. FIG. 7 shows the address allocation; the connection between read write data lines RWD and data output buffers Dout, data input buffers Din belonging to the respective input and output sections I/01 to 4; the connection between DQ buffers and the read write data lines RWD; and the connection between the DQ buffers and DQ lines for transferring data between the cell arrays. Here, the DQ buffers are disposed between the cell arrays and the read write data lines RWD to amplify data of the cell arrays and output the amplified data to the read write data lines RWD in read mode, and to write data on the read write data lines RWD in the cell arrays in write mode.

First, the address is allocated by allowing ¼ of 16 cell arrays in all to be active partially with the use of the row addresses A9R and A8R. The cell arrays operated in partial active mode are arranged as sets of 4 cell arrays as shown in FIG. 7. As a result, the four similar sets of cell arrays can be arranged. Further, the least significant bit A0C and the second-to-least significant bit AC1 of the column address are allocated to 4 sets of the cell arrays as shown. In this case, when a single column select line CSL is selected, four data bits are outputted simultaneously from the single cell array. These four data bits are allocated to the four input and output sections I/01 to 4, respectively. Here, the suffixes 1 to 4 attached to the DQ buffers are correspond to the numbers of the input and output sections I/01 to 4. Further, one DQ line is disposed so as to correspond to one DQ buffer, respectively.

On the other hand, with respect to the read write signal data lines RWD, 16 lines are required for the configuration as shown. This is because four read write data lines RWD are present in correspondence to pairs of the column address A0C, A1C for each of the input and output sections I/01 to 4. Therefore, when the read write data lines RWD are arranged in the form of pairs, the manufacturing cost increases with increasing size of the chip. Therefore, in this embodiment, the read write data lines RWD are not used in the form of pairs.

When the address is allocated as described above, it is possible to operate the core portion at quadruple period in the serial cycle. In this case, however, if a number of the counters or the address latch sections required to operate the core portion at n-time period are prepared as in the conventional way, since the counters must be arranged along 4 columns, the chip size increases inevitably.

In the present invention, therefore, the column address lines are divided for the physically same column on the basis of the sets of the column address A0C, A1C. FIG. 8 is a table for assistance in explaining the physical positional relationship between the column select lines and the address in comparison between the conventional configuration (on the left side) and the invention configuration (on the right side). FIG. 8 indicates that in the case of the conventional configuration, d0 is a region of one column select line determined by the pitch in the column direction of the cell array, and one column select line is outputted from this region. In the case of the invention configuration, d1 is a region for one column select line, which is about a half of the conventional region d0. As described above, when the column select lines CSL are divided as above, even if the circuit for controlling the main path of the serial system access is operated at twice the period, since the column address A1C changes only once in 4 cycles, the portion decoded by the column address A1C is selected and operated only once in the 4 cycles. In other words, the core portion such as DQ gates (for connecting the bit lines to the DQ lines) and DQ equalize sections (for precharging the DQ lines to the H level for equalization) can be operated at quadruple rate, thus enabling operational margin sufficiently.

The above-mentioned advantage is important in particular when the following operation is implemented at a high speed: cell data amplified and latched on the bit lines are outputted to the DQ lines via the DQ gates and further the data on the DQ lines are amplified and outputted to the read write data lines RWD. In other words, in order to realize a high speed operation, the DQ line sensing operation must be started at the stage where the quantity of the DQ line data is not so much. In this case, if the equalization is not sufficient, the quantity of data outputted after compensation for the imperfect equalization becomes the quantity of data to be sensed. Accordingly, the net quantity of data decreases in the data sensing operation. In the status as described above, since the sensing operation may be defective, the sensing start timing must be delayed eventually, thus disabling a high speed operation. As described above, in the configuration according to the present invention, it is possible to secure the DQ line equalization time sufficiently without increasing the chip size.

Further, in the write cycle, the status of the inversion signal of the output enable signal OE is acquired as data in the same way as with the case of the input and output data, and then written in the data lines for the inversion signal of the output enable signal OE, in correspondence to the combinations of the column address A1C, A0C of the serial address.

Figure 9:
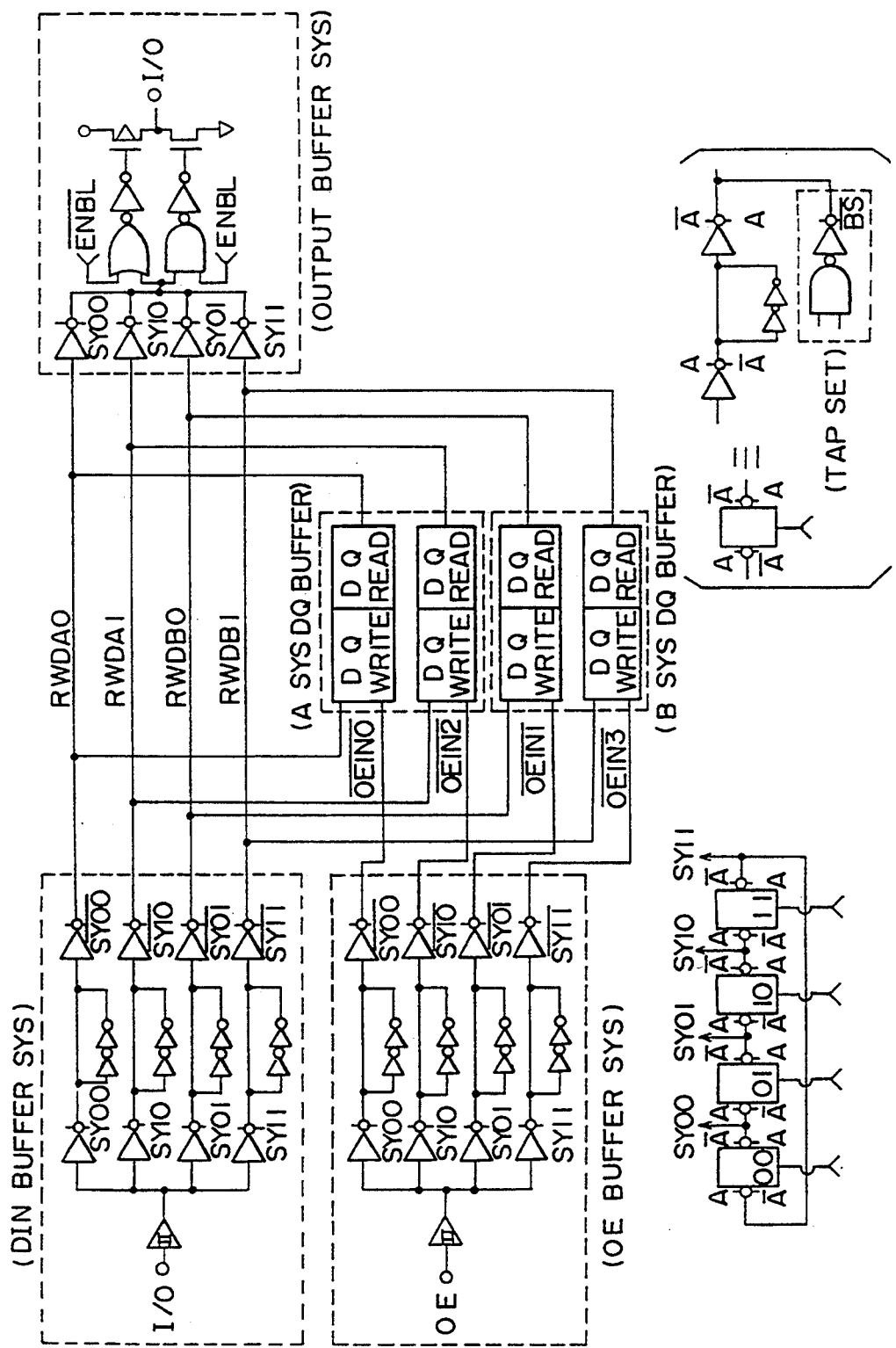
FIG. 9 is a block diagram showing a circuit for assistance in explaining the data flow.

FIG. 9 is a block diagram for assistance in explaining the data flow. The data flow will be described hereinbelow with reference to FIG. 9.

First, in the read cycle, when the read write latch signal RWL changes to the H level, one of signals SYij changes to the H level according to the tap address, to decode 4 sorts of the read write latch signals RWL and to select a gate for connecting the signal RWL to the output buffer.

The signals SYij to be changed to the H level are listed in a tap address table shown in FIG. 10, in which the status of the signal SYij of the address select circuit and the status in read and write with respect to each of 3 types A, B and C of the tap set section address input A0C, A1C are listed for comparison. Further, the tap address for setting the H level to the respective address select circuit is also shown, respectively. Here, the three types A, B and C are divided on the basis of the clock CLK beginning from which the effective data can be outputted, after the read write latch signal RWL has been changed to the H level. That is, in the case of the type A, the effective data can be outputted from the fourth cycle; in the case of the type B, the effective data can be outputted from the third cycle; and in the case of the type C, the effective data can be outputted from the second cycle.

Now, when the read write latch signal RWL changes to the H level, the set signal SYij is counted up beginning from the first clock CLK. In the case of the type B for instance, when the read write latch signal RWL changes to the H level under the condition that the tap address A1C, A0C is "01", the signal SY10 changes to the H level and the other signals are set to the L level. Here, in response to the first clock CLK, the signal SY10 changes to the L level, and the signal SY11 changes to the H level. Thereafter, in response to the second clock CLK, the signal SY11 changes to the L level and the signal SY00 changes to the H level. Further, in response to the third clock CLK, the signal SY00 changes to the L level and the signal SY01 changes to the H level. Therefore, the read write data lines RWD corresponding to the taps are connected to the output buffers, so that correct data can be outputted. In other words, the signal SYij corresponding to the tap address counted up n times is so set as to be changed to the H level, where n are "4", "3" and "2" in correspondence to the types A, B and C, respectively.

In write cycle, the cycle from which data acquisition begins starts from the cycle of the first clock CLK, irrespective of the types. Therefore, for instance when the read write latch signal RWL changes to the H level under the condition that the tap address A1C, A0C is "0", "1", respectively, the signal SY01 changes to the H level, and other signals SYij change to the L level. Therefore, the data of the input and output sections I/01 to 4 is acquired by the data input buffer Din corresponding to the address whose A1C, A0C is "0", "1", respectively. Here, in response to the first clock CLK, the signal SY01 changes to the L level, and the signal SY10 changes to the H level. At this time, the data of the input and output sections I/01 to 4 is acquired by the data input buffer Din corresponding to the address whose A1C, A0C is "1", "0", respectively. Further, when the signal SY01 changes to the L level, the inversion signal of the signal SY01 changes to the H level, so that the data acquired previously is outputted to the read write data line RWD corresponding thereto. With respect to the inversion signal of the output enable signal OE, the operation is the same as with the case of the input and output sections I/01 to 4. As described above, in the case of the write cycle, the signals SYij corresponding to the tap address A1C, A0C are changed to the H level due to the change of the read write latch signal RWL to the H level.

In FIG. 9, although the signals SYij are denoted by the same symbols for the data output buffers Dout, data input buffers Din, and the buffers for the inversion signal of the output enable signal OE, respectively, the signals SYij for data output buffers Dout are operative only in the read mode, and the signals SYij for the other are operative only in the write mode.

Figure 11:
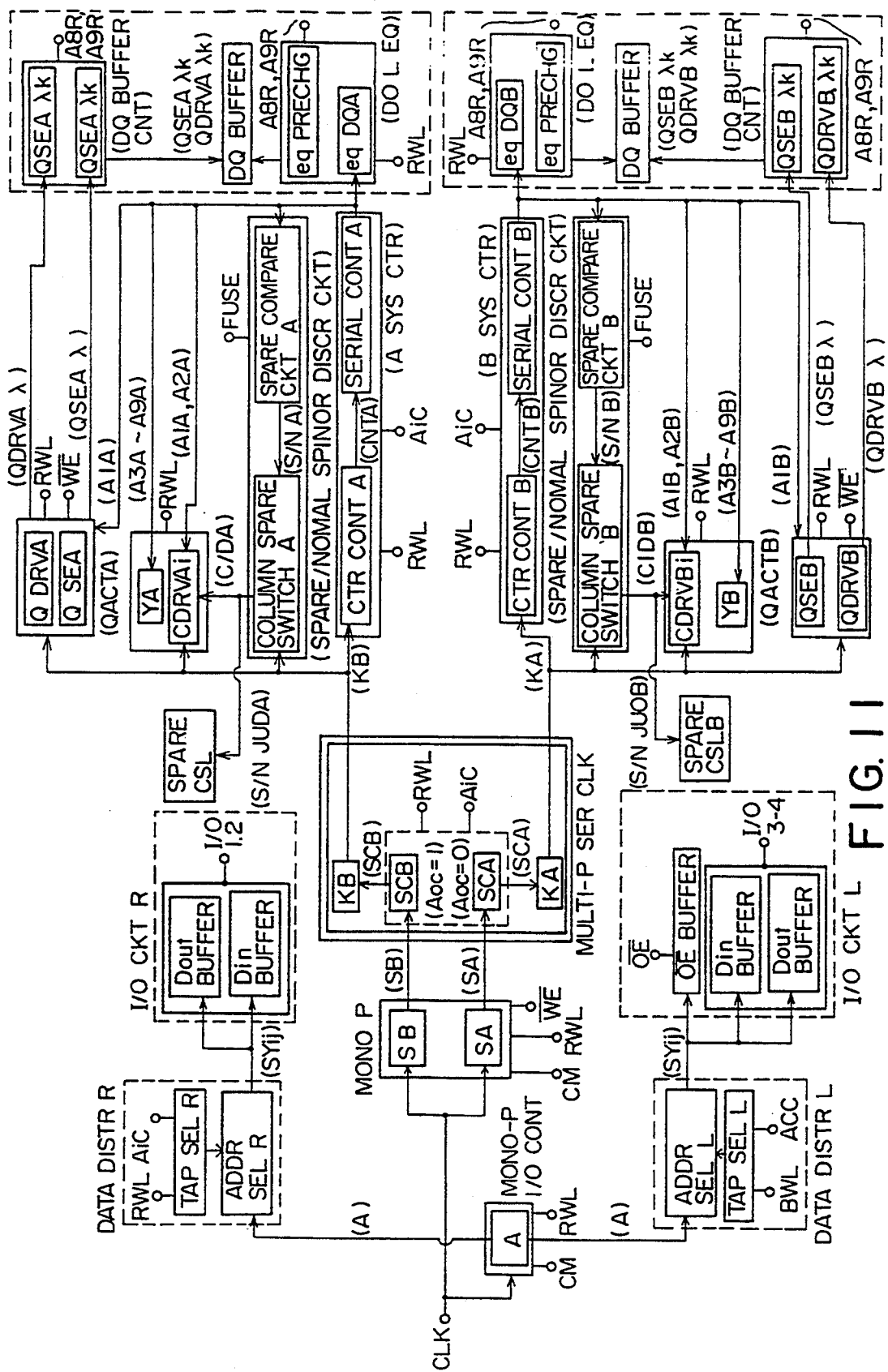
FIG. 11 is a block diagram showing a block for controlling the serial system.
Figure 12:
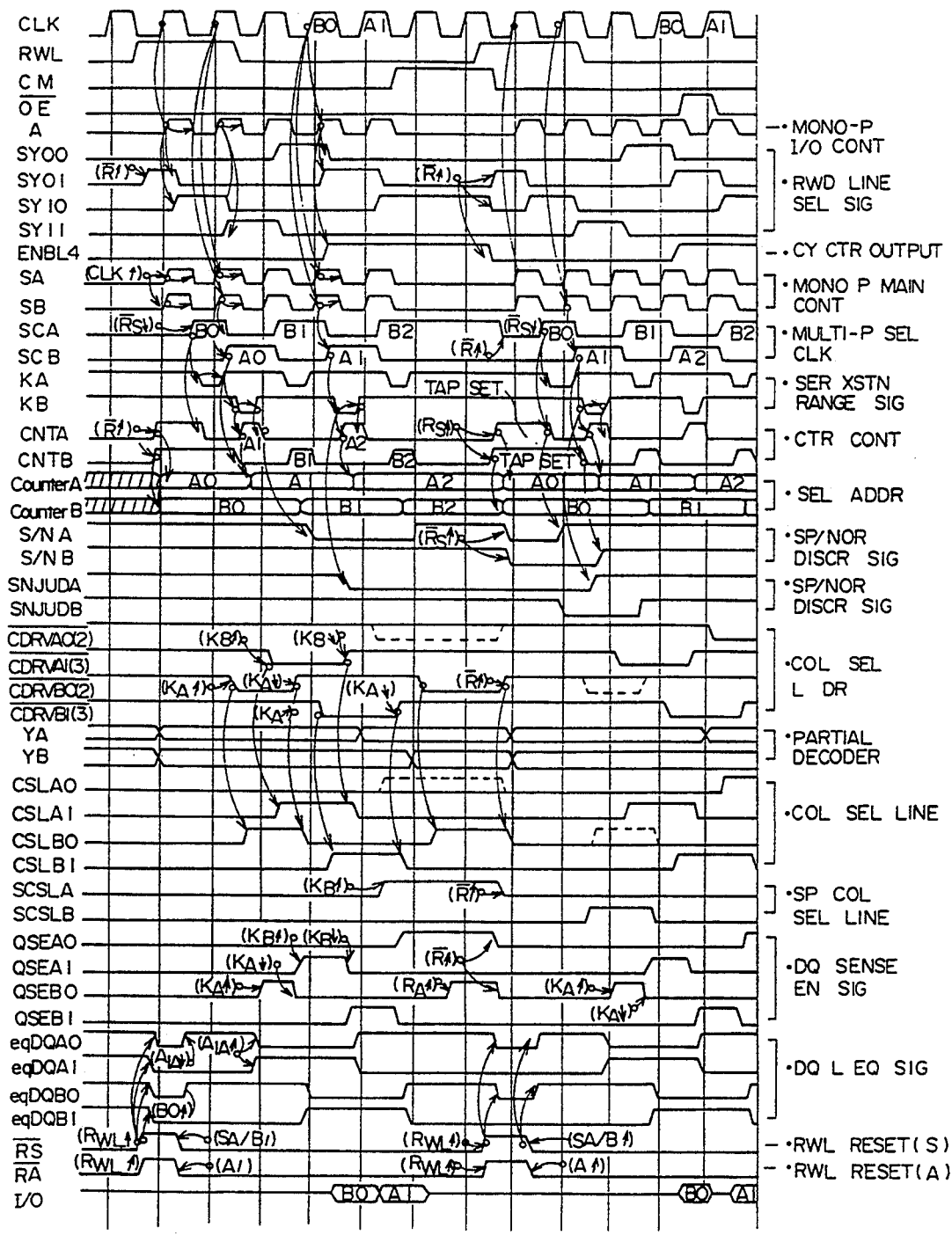
FIG. 12 is a timing chart in the read mode of the memory device shown in FIG. 1.
Figure 13:
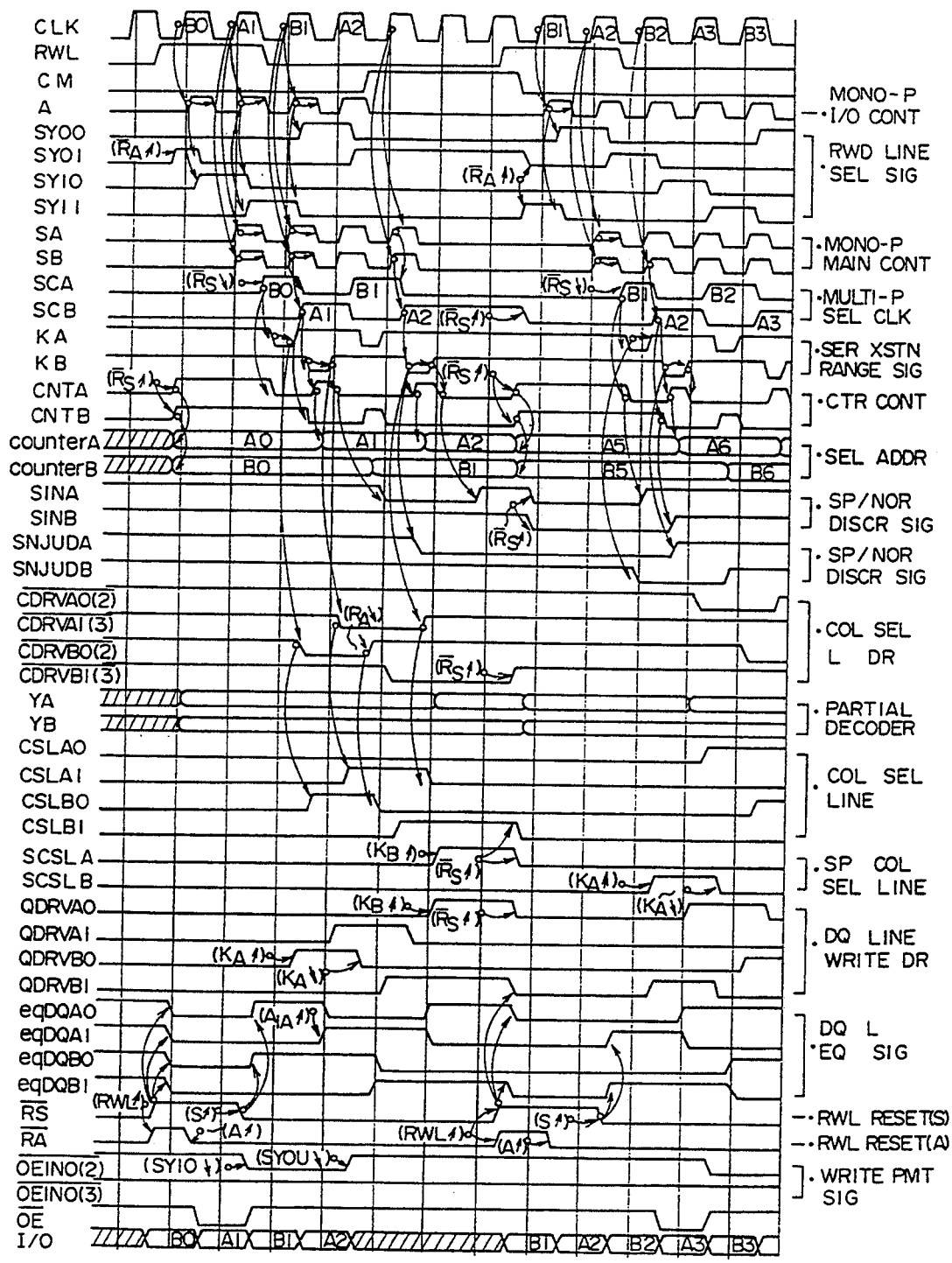
FIG. 13 is a timing chart in the write mode of the memory device shown in FIG. 1.

FIG. 11 is a block diagram showing a control block for a serial system in which the address allocation data flow as described above is adopted. In FIG. 11, the mutual relationship between the respective signals and between the respective circuits are shown. Further, FIG. 12 is a timing chart for assistance in explaining the operation of the respective signals in read cycle; and FIG. 13 is a timing chart for assistance in explaining the operation of the respective signals in write cycle.

Following is a brief description of the serial system with reference to FIG. 11.

The whole serial system can be divided into the data input buffer Din, the buffer for the inversion signal of the output enable signal OE, the monoperiod I/O control (the basic period signal is denoted by A), and the multiperiod system for controlling the main access pass (the basic monoperiod signals for operating the multiperiod system are denoted by SA and SB, respectively). Here, the basic signal A is a signal synchronizing with the clock CLK basically. In the case of the read mode, the monoperiod control system connects the read write data line RWD to the data output buffer Dout in sequence in accordance with the tap address. In the case of the write mode, the monoperiod control system connects the data input buffer Din and the buffer for the inversion signal of the output enable signal OE to the read write data line RWD and the line for the inversion signal of the output enable signal OE in sequence in accordance with the tap address. Further, in the cycle during which the clock mask signal is at the H level, the basic signal A is not operative. Accordingly, the counting up will not be effected by the operation of the basic signal A. Further, the operation of when the read write latch signal RWL changes to the H level is the same as explained before.

On the other hand, the control system of the main path is interleaved by the least significant bit A0C of the column address, so that the main path control system becomes the system operated in a multiperiod. Further, the respective interleaved systems are operated in pipeline mode to secure the operation margin. The main path control is controlled by interleaved multiperiod basic signal SCA or SCB (referred to as SCA/B, hereinafter). The multiperiod basic signal SCA/B is formed by the basic monoperiod signal SA or SB (referred to as SA/B, hereinafter), which is different from the basic monoperiod signal A described before.

The relationship between the respective circuits and the signals are as follows: either of the multiperiod basic signal SCA/B to be operated first is determined in accordance with the tap address. When the basic monoperiod signal SA/B changes to the H level, the multiperiod basic signal SCA/B changes. In this case, an L level pulse is formed in either of the serial transition range signal KA or KB (referred to as KA/B, hereinafter) whose level has been changed to the H level. During the L level pulse of the serial transition range signal KA/B, the old status is changed to the new status. Therefore, when the L level pulse ends; that is, the serial transition range signal KA/B changes to the H level, operation starts in a new status. In practice, when the serial transition range signal KA/B changes to the L level, the column select line CSL is activated and the DQ buffer is deactivated, and further switches the signals indicative of whether the spare column select line or the normal column select line is used in the new status. In response to the L level pulse, the address counter is counted up to switch the old address to the new address. When the serial transition range address signal kA/B changes to the H level, the column select line CSL corresponding to the new address is activated and the DQ buffer is also activated. The above-mentioned operation is alternated in the respective interleaved systems.

The serial system control has been described briefly with reference to FIG. 11. Here, the more detailed description of the read mode will be described hereinbelow with reference to FIG. 12.

When the read write latch signal RW1 changes to the H level, the inversion signals of the signals RS and RA change to the H level. Then, the serial system is reset. That is, the inversion signal of the signal CDRV for controlling the column select line SCL is deactivated, so that the column select line CSL is set to non-active status all over. Further, the signal QSE for controlling the sensing operation by the DQ buffer is deactivated. Further, the DQ line connecting between the cell array and the DQ buffers is all over equalized. Further, the tap address is set to the address counter. Furthermore, the I/O control signals SYij are set as described before.

Here, in response to the first clock CLK, the monoperiod basic signal SA/B (the monoperiod serial control signal) is operated, so that the inversion signal of the reset signal RS of the period serial clock is changed to the L level. When the inversion signal of the reset signal RS is reset to the L level, one of the multiperiod basic signal SCA/B changes to the H level in accordance with the tap address. At this time, the relationship between the tap address and the multiperiod basic signal SCA/B is as follows: if the tap address A0C is at "0", the multiperiod basic signal SCB is at the H level for the first monoperiod basic signal SA/B, and if the tap address A0C is at "1", the multiperiod basic signal SCA is at the H level for the first monoperiod basic signal SA/B. When one of the multiperiod basic signals SCA/B changes to the H level, the L level serial transition range signal KA/B is generated. Upon the end of the L level pulse of the serial transition range signal KA/B, the inversion signal of the column select line driver ADRVA or ADRVB (referred to as ADRVB/A, hereinafter) changes to the L level, and the signal A or B of the column select line signal CSL (referred to as CSLB/A, hereinafter) changes to the H level into an active status. At this time, either one of the four column select lines CSL formed by the combinations of the address A0C, A1C is allowed to be active by decoding in response to the inversion signal of the column select line driver ADRV.

When the column select line CSL is allowed to be active, as a result of address allocation, bit line data of the cell array are outputted to 4 pairs of the DQ lines equalized by Vcc and related to one cell array. At this time, the DQ line equalization is allowed to be nonactive when the inversion signal of the reset signal RS is reset to the L level. In this case, only two (whose A1C matches the tap address) of 4 sets of combinations of A0C, A1C are deactivated, and the remaining two sets are kept equalized. After a specific delay time has elapsed after the change of the serial transition range signal KA/B to the H level, the DQ sense enable signal QSEBAλ (lambda) or QSEAλ (referred to as QSEB/Aλ, hereinafter) is activated. In this case, only one of the 4 sets of combinations of the address A0C, A1C is activated. When one of the DQ sense enable signal QSEB/Aλ is activated, data on the DQ lines are sensed by the DQ buffers, and the sensed results are outputted to the read write data lines RWD. Since the latch circuits are attached to the read write data lines RWD, the data are latched by the read write data lines RWD are latched. In response to the first clock CLK, data are outputted to the read write data lines RWD and the outputted data are latched by the latch circuits.

On the other hand, with respect to the input and output sections I/01 to 4, when the first clock CLk is received and further the basic monoperiod signal SA changes to the H level, the signal SYij counts up one. Here, in the case of the type A, in response to the fourth clock CLK the data on the read write data line RWD prepared by the first clock CLK previously is outputted to the data buffer Dout.

In the ordinary serial cycle, the same operation as above is implemented. However, the counting up operation of the counters is additionally accompanied. On the basis of the L level pulse of the serial transition range signal KA/B, an H level pulse of a counter control signal CNTA or CNTB (referred to as CNTA/B, hereinafter) is formed. During the H level pulse of the counter control signal CNTA/B, the counter counts up. Further, the DQ line is equalized on the side where the address A1C is not selected and during the time when being not selected. By doing this, it is possible to secure the equalization time for tow cycles, so that the DQ line is precharged to the voltage Vcc for equalization. Further, the equalization can be made even when the equalize signal eqDQ is at the L level. Further, in the ordinary serial cycle, the multiperiod basic signal SCA/B is switched on the basis of the monoperiod basic signal SA/B.

The counter operation in the cycle after the read write latch signal RWL has been changed to the H level will be described with reference to FIG. 14. Irrespective of the tap address, the count up operation first begins in the counter whose address A0C is "0". Successively, the count up operation starts in the counter whose address A0C is "1". For instance, if the address A0C, A1C is "10", "00" changes to "01" through "10" and "11". Further, after the A0C="0" side counter (A system counter) is first counted up, the A0C="1" side counter (B system counter) is next counted up, in the respective counters on A0C="0" side and on A1C="1" side of the counters from A1C to A9C.

For the reason as described above, in the present invention the logic as shown in FIG. 14 has been adopted, which is used in general to control the counters of interleaved system. In general, when the counters in the interleaved system are directly related to each in such a way that the output of the B system counter is inputted to the A system and the inputted B system value is counted up by one and thereafter outputted; and further the output of the A system counter is inputted to the B system and the output of the A counter is outputted as it is as the B system counter, there exists such a problem that the operational speed of the A system is affected by the operational speed of the B system or vice versa. In the present invention, however, since the A system counter is confined in the A system and the B system counter is confined in the B system, it is possible to use effectively the multiperiod formed by interleaf.

As shown in FIG. 12, when the clock mask signal CM is used, the monoperiod basic signal A and the monoperiod basic signal SA/B are both not operative in the cycle in which the clock mask signal CM is at the H level. Therefore, since the system connected to these signals is not operative, the status of the signals will not change.

The write mode operation will be described in detail hereinbelow with reference to FIG. 13.

When the read write latch signal changes to the H level, the inversion signals of the reset signals RS and RA for resetting the serial system change both to the H level to start resetting. That is, the inversion signal of the column select line driver CDRV for controlling the column select line CSL to be active or non-active changes to the H level, so that the column select line CSL is deactivated. Therefore, the bit line and the DQ line are both turned off. Further, all the DQ line equalize signal is activated, so that the DQ line is equalized and therefore precharged. Further, since the tap address is set to the address counter, and additionally the I/O control signal SYij (which satisfies a combination of the tap address A0C, A1C) changes to the H level, and the value at the input and output I/01 to 4 and the value of the inversion signal of the output enable signal OE are acquired as data. The multiperiod basic signal SCA/B is forcibly set to the L level and therefore reset. The counter control signal CNTA/B is reset to the H level, the tap address set to the succeeding cycle output preparation node of the counter via an inverter is set to the output node of the counter, as already described.

The write operation of the present invention can be completed in response to two successive clocks CLK. In more detail, in response to the first clock CLK, data inputted to the data input buffer Din and to the buffer for the inversion signal of the output enable signal OE are latched, and further the data latched by the read write data line RWD and the inversion signal line of the output enable signal OE are outputted.

Further, in response to the second clock CLK, the column select line CSL is activated and the DQ line write signal is activated, so that the data acquired in response to the first clock is written in the cell array. Accordingly, in response to the first clock after the read write latch signal RWL has changed to the H level, being different from the read cycle, the monoperiod basic signal SA/B for operating the multiperiod basic signal SCA/B is not operated, with the result that the multiperiod clock system related thereto will not be operated.

On the other hand, the basic monoperiod signal A for controlling the I/O is operated in response to the first clock. When the basic monoperiod signal A rises, the signal SYij already set to the H level on the basis of the tap address changes to the L level, and the signal SYij corresponding to the succeeding address changes to the H level. At this time, the latched data is written in the read write data line RWD corresponding to the address changed to the L level. In the status where the inversion signal of the signal RA is at the H level, the signal SYij is set in correspondence to the tap address. In the second cycle after the read write latch signal RWL has changed to the H level, the basic monoperiod signal A for I/O control operates in the same way as with the case of the first cycle. The monoperiod basic signal SA/B for controlling the multiperiod basic signal SCA/B also starts operating. Accordingly, either one of the multiperiod basic signals SCA or SCB changes to the H level in accordance with the tap address. At this time, it is determined whether signal SCA or SCB is first changed to the H level in accordance with the tap address, in the same way as the case of the read cycle. When the serial transition range signal KA/B is changed to the H level, an L level pulse having a specific pulse width is generated in the serial transition range signal KA/B. When the serial transition range signal KA/B changes to the L level, a discriminating circuit discriminates whether the spare column select line or the normal column select line is used.

After the pulse of the serial transition range signal KA/B ends and therefore changes to the H level, in the case where the normal column select line is used, the inversion signal of the column select line driver signal CDRV B or CDRV A (referred to as CDRVB/A, hereinafter) changes to the L level. In the case where the spare column select line is used, the signal SCSL B or SCSL A (referred to as SCSLB/A, hereinafter) changes to the H level. Further, when the monoperiod basic signal SA/B is operated in response to the first clock CLK, the inversion signal of the serial system reset signal RS is reset to the L level. Further, when the inversion signal of the reset signal RS changes to the L level, the equalize signal eqDQ A or eqDQ B (referred to as eqDQA/B, hereinafter) of the DQ line is reset to the H level, to release the equalization. However, only the side designated by the tap address A1C is released from the equalization, and the other DQ lines are kept equalized.

When the serial transition range signal KA/B changes to the H level, the DQ line write signal QDRV A or QDRV B (referred to as QDRVB/A, hereinafter) is activated. When the DQ line write signal QVRV is activated, data on the read write data line RWD is written in the DQ line, and then written in the bit line. Only when the data acquired by the inversion signal line of the output enable signal OE is at the H level; that is, only in the cycle in which the writing is enabled, data can be written in the DQ line via the DQ buffer. The operation after the second clock is the same as above, and the logic for determining the cycle in which the counter begins to count up is also the same as the case of the read mode.

In the clock cycle in which the clock mask signal CM is changed to the H level, the operation is different from that in the read cycle as follows: after the clock mask signal CM has been changed to the H level, the basic monoperiod signal A as the I/O control signal does not operate. Therefore, the signal SYij derived by this signal will not operate. Further, the data acquired in response to the final clock CLK generated before the clock mask signal CM changes to the H level must be written. Therefore, in response to the first clock CLK generated after the clock mask signal CM has been changed to the H level, the multiperiod clock is operated to activate the circuits of the writing system, and the basic monoperiod signal SA/B for operating the multiperiod clock operates. In response to the second and subsequent clocks after the clock mask signal CM has been changed to the H level, the basic monoperiod signal SA/B will not operate. In the first clock after the clock mask signal CM has been changed to the L level, although the basic monoperiod signal A of the I/O control signal operates, the basic monoperiod signal SA/B will not operate. However, in response to the second clock CLK, the basic monoperiod signal SA/B begins to operate. As described above, it is possible to allow the address and the data to be consistent by controlling the serial system.

As described above, since the write cycle can be executed by using two clocks, it is possible to increase the margin of the data write operation. Further, since the write operation which takes a long time is divided into two, it is possible to reduce the cycle time of the data writing operation, thus the operational frequency of the serial cycle being increased remarkably.

Figure 53:
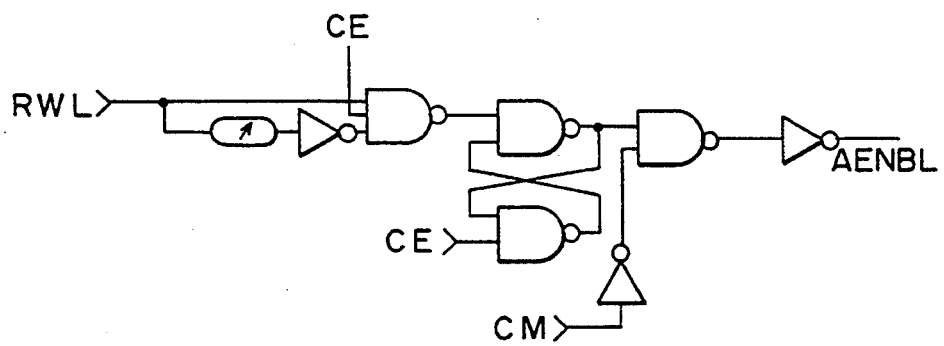
FIG. 53 is a circuit diagram showing a circuit for generating the signal for controlling the generation of the basic monoperiod signal A.
Figure 54:
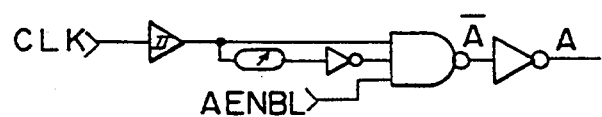
FIG. 54 is a circuit diagram showing a circuit for generating the basic monoperiod signal A.

FIG. 53 shows a circuit for generating a control signal AENBL for generating the basic monoperiod signal A on the basis of the read write latch signal RWL and the chip enable signal CE. FIG. 54 shows a circuit for generating the basic monoperiod signal A on the basis of the control signal AENBL as shown in FIG. 53 and the clock CLK. The basic monoperiod signal A can be obtained on the basis of the clock CLK with the use of the logic circuits as shown in FIGS. 53 and 54.

Figures 15, 16:
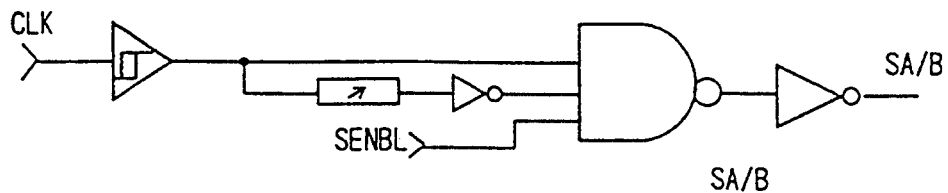
FIG. 15 is a circuit diagram showing a circuit for generating the basic monoperiod signal SA/B.
FIG. 16 is a table for assistance in explaining the operation of the generating circuit shown in FIG. 15.

FIG. 15 shows a circuit for generating the basic monoperiod signal SA/B for controlling the switching operation of the multiperiod basic signal SCA/B which is used as the basis of operating the main path control system. In this circuit, the basic monoperiod signal S can be generated by controlling the clock CLK by the control signal SENBL. The operation thereof is different between the read mode and the write mode, as described below with reference to FIG. 16.

The read cycle will be first described hereinbelow. The basic monoperiod signal SA/B is disabled from when the chip enable signal CE changes to the H level to when the first read write latch signal RWL changes to the H level. After the chip enable signal CE has been changed to the L level, the basic monoperiod signal SA/B is kept inoperative. In other words, from the first and subsequent clocks after the chip enable signal CE has been changed to the L level, the basic monoperiod signal SA/B will not operate. From the first and subsequent clocks after the read write latch signal RWL has been changed to the H level, the basic monoperiod signal SA/B is enabled to be operative. From the first clock CLK after the clock mask signal CM has been changed to the H level, the basic monoperiod signal SA/B is enabled to be operative, and from the first clock CLK after the clock mask signal CM has been changed to the L level, the basic monoperiod signal SA/B is enabled to be operative.

The operation of the write cycle will be described hereinbelow. After the chip enable signal CE has been changed to the H level, until the read write latch signal RWL changes first to the H level, the basic monoperiod signal SA/B is kept inoperative. Further, after the chip enable signal CE has been changed to the L level, the basic monoperiod signal SA/B is allowed to be operative in response to the first clock CLK, but allowed to be inoperative in response to the second and subsequent clocks CLK. Further, after the read write latch signal RWL has been changed to the H level, the basic monoperiod signal SA/B is allowed to be inoperative in response to the first clock CLK, but allowed to be operative in response to the second and subsequent clocks CLK. Further, after the clock mask signal CM has been changed to the L level, the basic monoperiod signal SA/B is allowed to be inoperative in response to the first clock CLK, but allowed to be operative in response to the second and subsequent clocks CLK.

Figure 17:
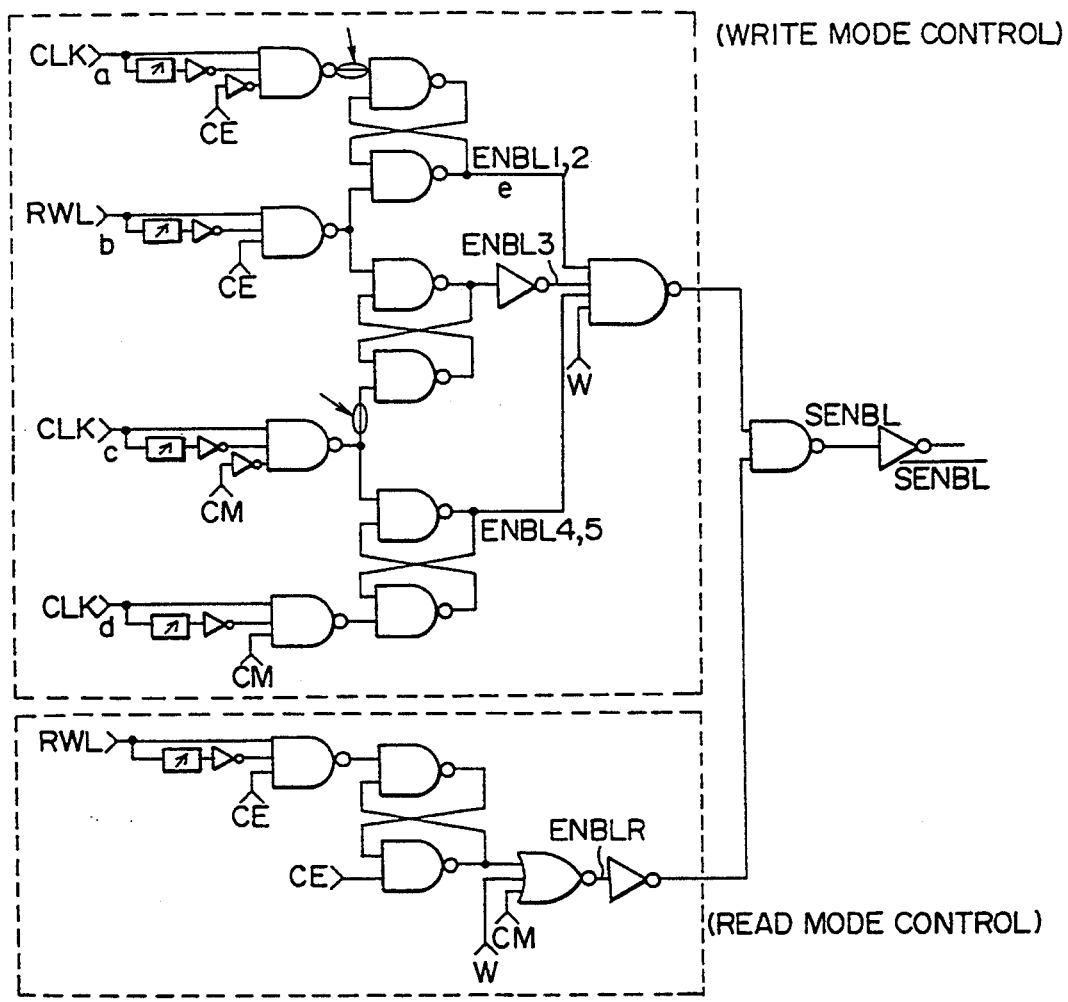
FIG. 17 is a circuit diagram showing a circuit for controlling the generation of the basic monoperiod signal SA/B.

FIG. 17 shows a circuit for generating a control signal SENBL for controlling the basic monoperiod signal SA/B as described above. In FIG. 17, in order to secure the operational margin, the signals at points a, b, c and d are delayed. A flip-flop in which the input portion at point a and the input portion at point b are combined corresponds to the control portion related to the first and second items in table shown in FIG. 16. A flip-flop in which the input portion at point b and the input portion at point c are combined corresponds to the control portion related to the third item in table shown in FIG. 16. Further, a flip-flop in which the input portion at point c and the input portion at point d are combined corresponds to the control portion related to the fourth and fifth items in table shown in FIG. 16. When the control signal SENBL is at the H level, a pulse is generated in the basic monoperiod signal SA/B; but when the control signal SENBL is at the L level, a pulse is not generated in the basic monoperiod signal SA/B, even if the clock CLK changes to the H level.

FIG. 18 is a circuit for generating the multiperiod signal SCA/B on the basis of the monoperiod signal SA/B. FIG. 19 is a circuit for controlling the initialization of the circuit shown in FIG. 18. FIGS. 20 and 21 are tables for assistance in explaining the operation of the circuit shown in FIG. 18.

First, after the read write latch signal RWL has been changed to the H level, the inversion signal of the reset signal RS shown in FIG. 19 changes to the H level. Accordingly, in FIG. 18, the value of the tap address A0C is set in accordance with the rule as shown in FIG. 21. Therefore, it is possible to determine the multiperiod basic signal SCA/B which first changes to the H level. Further, when the reset signal RS changes to the H level, the multiperiod basic signal SCA/B is forcibly changed to the L level for initialization. When a first basic monoperiod signal SA/B is inputted after the read write latch signal RWL has been changed to the L level, the operation starts in accordance with the tap address A0C, A1C. In more detail, if the tap address A0C is at the L level, the multiperiod basic signal SCB/B changes to the H level, and if the tap address A0C is at the H level, the multiperiod basic signal SCB/B changes to the L level. Further, when an appropriate number of clocks CLK are inputted for precharge after the chip enable signal CE has been changed to the L level, the inversion signal of the reset signal RS changes to the H level, and the multiperiod basic signals SCA/B changes together to the L level for initialization.

FIG. 19 shows a circuit for controlling the initialization after the read write latch signal RWL has been changed to the H level. Here, the invention signal of a signal PR changes to the L level into the precharge status, but to the H level when the chip enable signal CE changes to the H level into the active status.

Figure 22:
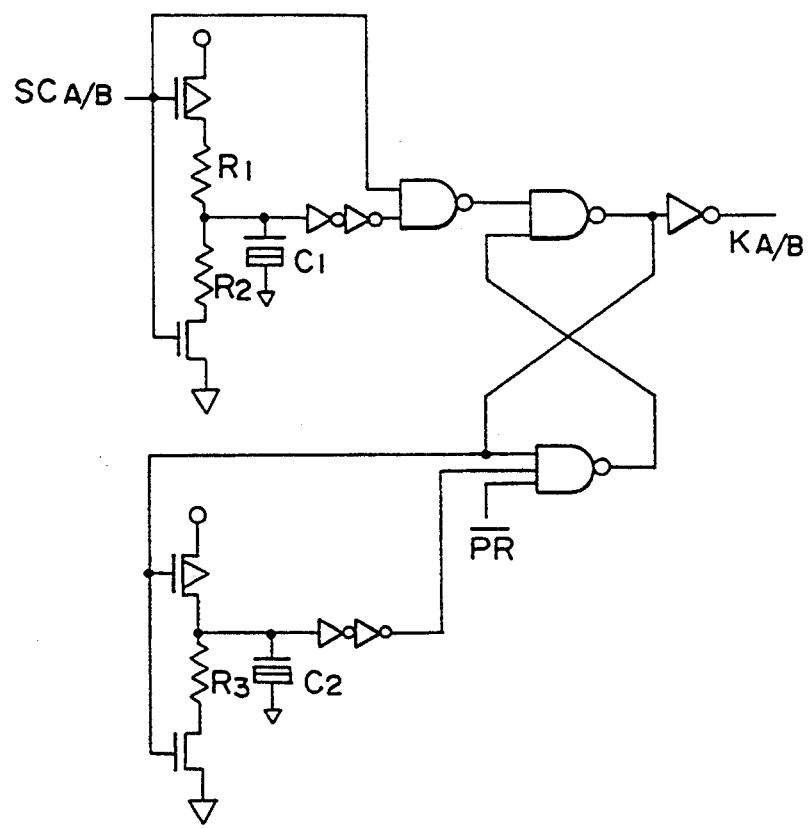
FIG. 22 is a circuit diagram showing a circuit for generating a serial transition region signal.

Serial transition range signal KA/B for defining the status transition range during serial cycle will be described hereinbelow with reference to FIGS. 22 and 23. FIG. 22 is a circuit for generating the serial transition range signal KA/B, and FIG. 23 is a table for assistance in explaining the operation of the circuit shown in FIG. 22.

The operation of the circuit as shown in FIG. 22 is as follows: after the chip enable signal CE has been changed to the H level into active cycle, and further when the multiperiod basic signal SCA/B changes to the H level, an L level pulse having a specific pulse width is generated. In this case, the pulse width is determined by a capacitance C2 and a resistance R3 roughly as $C2 \times R3$. Further, a resistance R1 is connected to stop the operation of the serial transition range signal KA/B, in the case where the multiperiod basic signal SCA/B does not have the L level pulse having a width over a predetermined value (because the operation is abnormal). When this resistance R1 is inserted, since the L level status is maintained for a time duration of about $R1 \times C1$ required to charge the capacitance C1, this L level status serves as a noise filter for the multiperiod basic signal SCA/B. Further, in the precharge status, the serial transition range signal KA/B is changed to the H level for initialization.

Figures 25, 26:
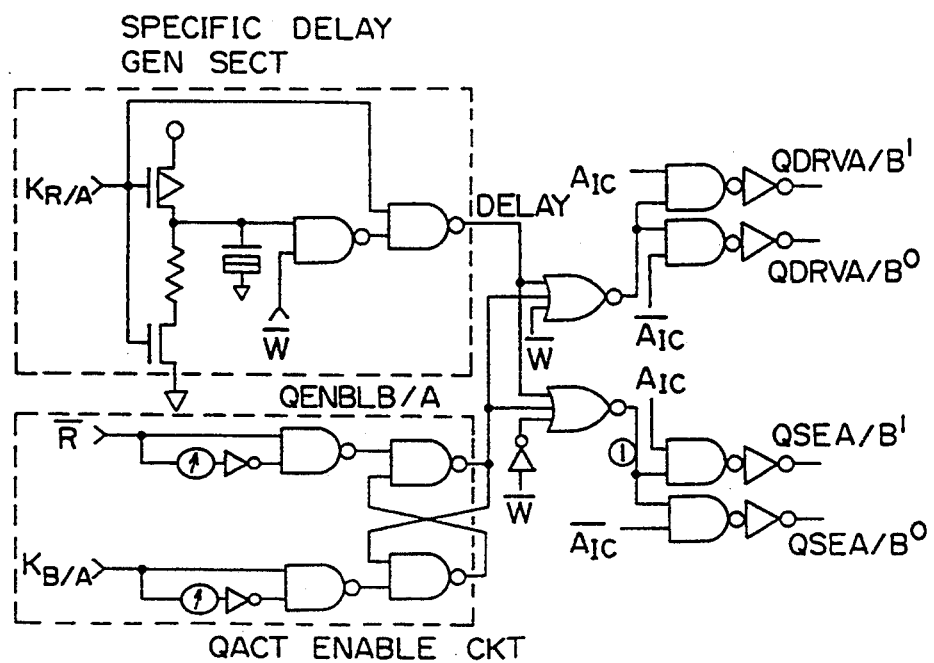
FIG. 25 is a table for assistance in explaining the operation of the generating circuit shown in FIG. 24.
FIG. 26 is a circuit diagram showing a circuit for generating the DQ buffer control signal.

The column select line driver will be described hereinbelow with reference to FIGS. 24 and 25. FIG. 24 shows a circuit for generating the inversion signal of the column select line driver signal CDRVAi or CDRVBi (referred to as CDRVA/B, hereinafter). FIG. 25 is a table for assistance in explaining the operation of the circuit shown in FIG. 24.

When the inversion signal of the column select line driver signal CDRVA/Bi changes to the L level, the column select line CSL is activated. Between when the chip enable signal CE has been changed to the H level into active status and when the first basic monoperiod signal A operates, this signal CERVA/Bi is fixed at the H level to allow the column select line CSL to be deactivated. Further, when the read write latch signal RWL changes to the H level, the inversion signal of the signal R changes to the H level, so that the signal B/A at point a is set to the L level. Accordingly, the inversion signal of the column select line driver signal CDRVA/Bi changes entirely to the H level, so that the column select lines CSL are forcibly deactivated. After the read write latch signal RWL has been changed to the H level and further when the first serial transition range signal KA/B changes to the L level, the inversion of the column select line driver signal CDRVA/Bi can be changed to the L level. When the serial transition range signal KA/B changes to the H level, the inversion signal of the column select driver signal CDRVA/Bi selected by the address at this time point changes to the L level.

Further, in the precharge status, the inversion signal of the column select driver signal CDRVA/Bi changes entirely to the H level to deactivate the column select line CSL. Further, in FIG. 24, an NAND gate to which the address A1C, A2C is inputted decodes partially the column address on the basis of the inputted address. Further, in the precharge status, since the inversion signal of the signal R is reset to the H level, the inversion signal of the column select driver signal CDRVA/Bi is reset to the H level all over in the precharge status.

Circuits for generating DQ buffer control signals QSEAλ or QSEBλ (referred to as QSEA/Bλ, hereinafter) and QDRVAλ or QDRVBλ (referred to as QDRVA/Bλ, hereinafter) will be described hereinbelow with reference to FIGS. 26, 27 and 28. FIG. 26 shows the circuit for generating the DQ buffer control signal QSEA/Bλ or QDRVA/Bλ, and FIG. 27 is a table for assistance in explaining the operation of the circuit shown in FIG. 26.

After a specific delay time has elapsed after the change of the serial transition range signal KA/B to the H level, the DQ buffer control signal QSEA/Bλ changes to the H level. Further, after the serial transition range signal KA/B is changed to the L level, the DQ buffer control signal QSEA/Bλ changes to the L level. Here, the specific delay time is determined by a specific delay generating section having a resistance and a capacitance as the main parts. When the read write latch signal RWL changes to the H level, the DQ buffer control signal QSEA/Bλ is reset entirely to the L level to release the DQ line data sense status. Further, in the precharge status, the DQ buffer control signal QSEA/Bλ is reset to the L level and kept at this L level, until the active cycle obtained after the succeeding chip enable signal CE has been changed to the H level. On the other hand, in the active status, the DQ buffer control signal QSEA/Bλ is kept at the L level, until the serial transition range signal KA/B changes first to the L level. When the DQ buffer control signal QSEA/Bλ changes to the H level, the DQ line data sense status is released.

The DQ buffer control signal QDRVA/Bλ changes to the H level when the serial transition range signal KA/B changes to the H level, to write the data outputted to the read write data line RWD in the DQ line. Further, the DQ buffer control signal QDRVA/Bλ changes to the L level when the serial transition range signal KA/B changes to the L level, to release the data in the DQ line. When the read write latch signal RWL changes to the H level, the DQ buffer control signal QDRVA/Bλ is reset to the L level all over. In the precharge status, the DQ buffer control signal QDRVA/Bλ is reset to the L level into the active status, and kept at the L level until the first serial transition range signal KA/B changes to the L level.

Here, the inversion signal of a signal W determines whether the DQ buffer control signal QDRVA/Bλ or the DQ buffer control signal QSEA/Bλ is operated. This inversion signal of the signal W is at the H level in the read cycle and at the L level in the write cycle, which corresponds to the signal obtained by acquiring the inversion signal status of the write enable signal WE by a λ section.

The DQ buffer control decode signal QSEA/Bλk and DQ buffer control decode signal QDRVAλk or QDRVBλk (referred to as QDRVA/Bλk, hereinafter) obtained by decoding the DQ buffer control signal in correspondence to the partial active status of the cell array will be described with reference to FIGS. 29, 30, 31, 32 and 33. FIGS. 29 and 30 show the decoding circuits, and FIG. 31, 32 and 33 are tables for assistance in explaining the operation of the circuits shown in FIGS. 29 and 30.

First, these signals are so controlled that only the buffer connected to the DQ line related to the activated cell array can be operated. Here, with reference to the overall address map shown in FIG. 7, the partial active status can be realized by the address A9R, A8R. Here, one of the DQ lines arranged on both sides of the activated cell array is used in common with the adjacent cell array. Therefore, the partial active status must be realized, even if either one of the arrays is activated. This operation can be made by a signal kACTk shown in FIG. 29 and a signal RBSi shown in FIG. 30.

The circuit operation as described above will be explained with reference to FIG. 33. The signal RBSi corresponding to only the combination of address selected by the partial active operation changes to the H level. In other words, an OR condition of the signal RBSi corresponding to two adjacent cell arrays is obtained. Therefore, by use of this signal RACTk, the DQ buffer control signal QSEA/Bλ and QDRVA/Bλ are decoded. The signals for operating only the DQ buffer connected to the cell array to be activated are DQ buffer control decode signals QSEA/Bλk and QDRVA/Bλk.

Figures 37, 38:
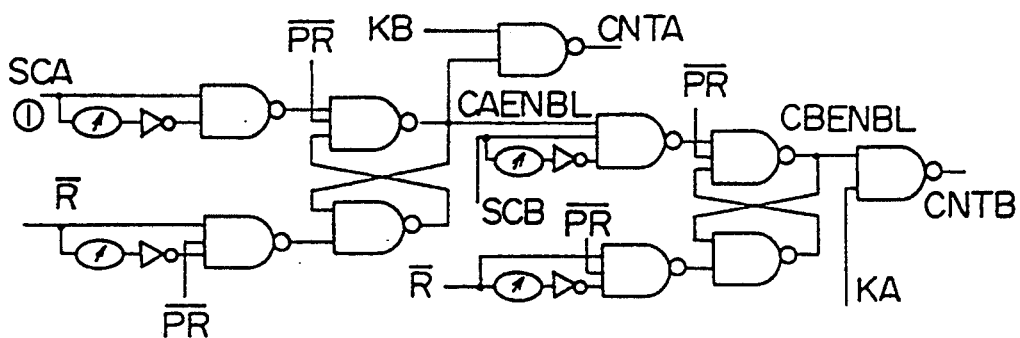
FIG. 37 is a table for assistance in explaining the operation of the generating circuit shown in FIG. 35.
FIG. 38 is a circuit diagram showing a circuit for generating the address counter control signal.

The operation of the circuits for generating signals for equalizing the DQ line will be described hereinbelow with reference to FIGS. 34, 35, 36 and 37. FIG. 34 is a circuit diagram showing a circuit for generating the DQ line equalize signal; FIG. 35 is a circuit diagram showing another circuit for generating the DQ line equalize signal; FIG. 36 is a table for assistance in explaining the operation of the circuit shown in FIG. 34; and FIG. 37 is a table for assistance in explaining the operation of the circuit shown in FIG. 35. The DQ line equalizing circuit can be divided roughly into two types. One is a circuit for setting the DQ line to the bit line precharge level when the DQ line is not selected in the precharge status or in partial active status of the cell array, which is shown in FIG. 34. The other is a circuit for precharging the DQ line to Vcc when the DQ line connected to the selected cell array is not selected in the serial cycle, which is shown in FIG. 35.

Figure 43:
FIG. 43 is a circuit diagram showing a circuit for generating the signal RB applied to the circuits shown in FIGS. 40 and 41.

In FIG. 43, in the active cycle in which the chip enable signal CE changes to the H level, if the operation enters the partial active mode, the inversion signal of the equalize signal EQPRk of the DQ line connected to the cell array selected in the partial active mode is changed to the H level to release the equalize status. Further, if the operation enters the precharge status, the inversion signal of the equalize signal EQPRk of all the cell arrays is changed to the L level all over to obtain the equalize precharge status.

On the other hand, in FIG. 35, when the cell array to be activated is decided in the active cycle, only the equalize signal related to only the activated cell array is enabled to be operative. When the read write latch signal RWL changes to the H level, the inversion signal of the signal R changes to the H level, the inversion signal of the equalize signal EQESA/Bλk applied to the DQ line connected to the cell array selected in the partial active mode changes to the L level to obtain the equalize status. In the serial cycle, the DQ line whose address A1C is not selected is equalized. Further, in the precharge status, the inversion signal of the equalize signal EQSEA/Bλk of all the cell arrays is changed to the H level all over to disable the Vcc equalization.

Figures 39, 40:
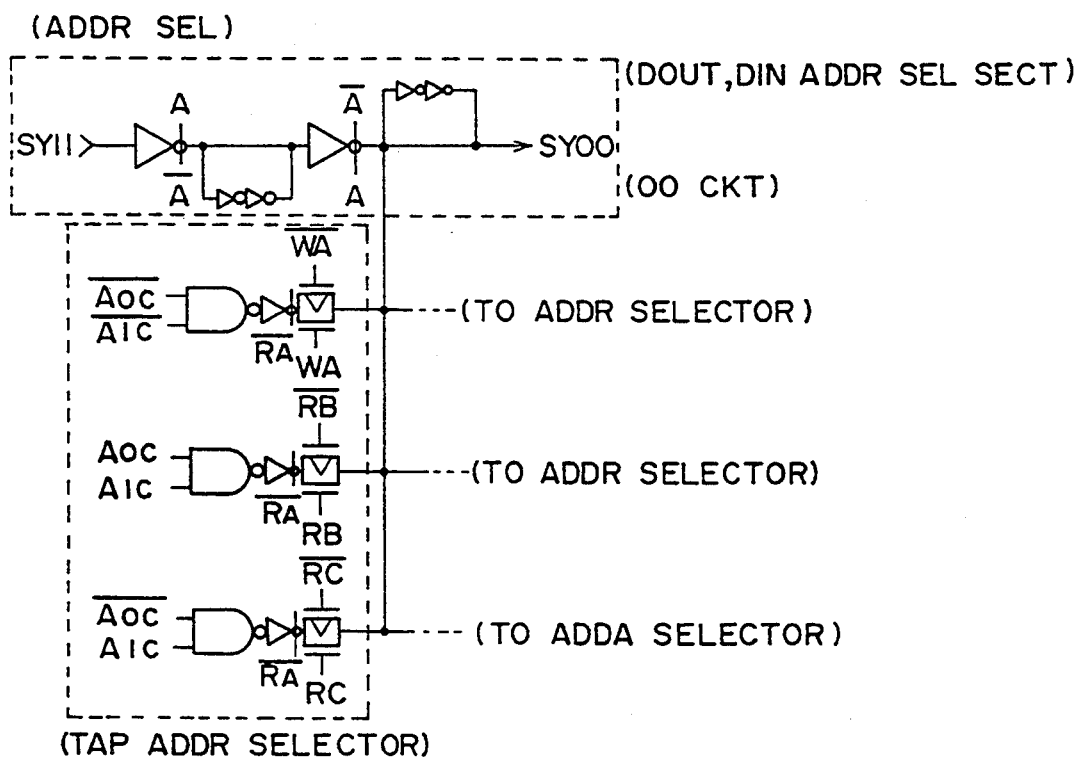
FIG. 39 is a table for assistance in explaining the operation of the generating circuit shown in FIG. 38.
FIG. 40 is a circuit diagram showing an address selector.

A circuit for forming a signal for controlling the address counter will be described with reference to FIGS. 38 and 39. FIG. 38 is a circuit diagram showing a control signal generating circuit; and FIG. 39 is a table for assistance in explaining the operation of the circuit shown in FIG. 38.

In the circuit configuration shown in FIG. 38, the counter is counted up as follows. First, when the read write latch signal RWL changes to the H level, a counter control signal CNTA/B is fixed to the H level. This is because in the first cycle the tap address set to the output preparation node of the counter is used as the output of the counter. Successively, after the read write latch signal RWL has been changed to the H level, in the cycle during which the first multiperiod basic signal SCA changes to the H level, the A system counter is allowed to be operative. The count-up operation of the counter is effected when the pulse of the serial transition range signal KA/B is at the L level. In other words, the counter control signal CNTA/B can be controlled by the serial transition range signal KA/B, and the counting-up operation of the counter is effected when the counter control signal CNTA/B is at the H level. Further, when the counter control signal CNTA/B is at the L level, the counting-up operation of the B system counter is effected. In the precharge status, the counter control signal CNTA/B is set to the L level together.

Figure 42:
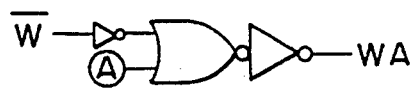
FIG. 42 is a circuit diagram showing a circuit for generating the signal WA applied to the circuits shown in FIGS. 40 and 41.
Figure 44:
FIG. 44 is a circuit diagram showing a circuit for generating the signal RC applied to the circuits shown in FIGS. 40 and 41.
Figure 45:
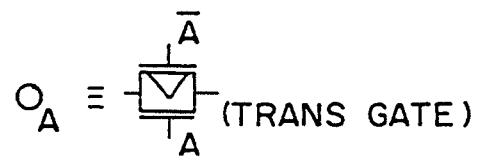
FIG. 45 is a circuit diagram showing a transfer gate used for the circuits shown in FIGS. 40 and 41.

The signal SYij for selecting the output data and the address in which the data is written will be described with reference to FIG. 40, FIG. 41, FIG. 43, FIG. 44, FIG. 45, FIG. 46, FIG. 47 and FIG. 48. FIG. 40 is a circuit diagram showing an address selector; FIG. 41 is a circuit diagram showing a tap address control circuit; FIG. 42 is a circuit diagram showing a circuit for generating the signal WA applied to the circuit shown in FIG. 41; FIG. 43 is a circuit diagram showing a circuit for generating the signal RB applied to the circuits shown in FIGS. 40 and 41; FIG. 44 is a circuit diagram showing a circuit for generating the signal RC applied to the circuits shown in FIGS. 40 and 41; FIG. 45 is a circuit diagram showing a transfer gate applied to the circuits shown in FIGS. 40 and 41; and FIGS. 46, 47 and 48 are tables for assistance in explaining the operation of the circuits shown in FIG. 40 and 41.

As already explained, the signal SYij operates in different way according to the types A, B and C, respectively, which is explained in further detail with reference to FIGS. 46 and 47. In FIG. 46, the numbers of the signal SYij to which the H level is set on the basis of the value of the tap address A0C, A1C are listed according to the types and modes. For instance, in the type B, when the tap address A1C is "1" and A0C is "0", the signal SYij to which the H level is set is SY11 in the read cycle mode and SY10 in the write cycle mode.

To obtain the operation as listed in the tables shown in FIGS. 46 and 47, the address to be set is controlled by the tap address control circuit as shown in FIG. 41. In FIG. 41, the transfer gates as shown in FIG. 45 are used, and distributors of three different destinations are arranged to output each of the combinations of the respective address. The three different gates are: a gate turned on when the type A and the write mode of all the types are used to input the signal WA; a gate turned on when the type B and only the read mode are used to input the signal PB; and a gate turned on when the type C and only the read mode are used to input the signal PC. In the circuit shown in FIG. 41, the signal SYij is set according to the tap address. Thereafter, whenever the monoperiod basic signal A changes to the H level in the serial cycle, the signal SYij of the circuit shown in FIG. 40 is changed to the H level in sequence. The address A0C, A1C shown in FIG. 41 is outputted from the column address buffer to set the tap address. Further, this address can be set to the address select circuit, only between when the read write latch signal RWL has been changed to the H level and further the inversion signal of the signal RA changes to the H level and when the inversion signal of the signal RA is reset to the L level.

Figure 49:
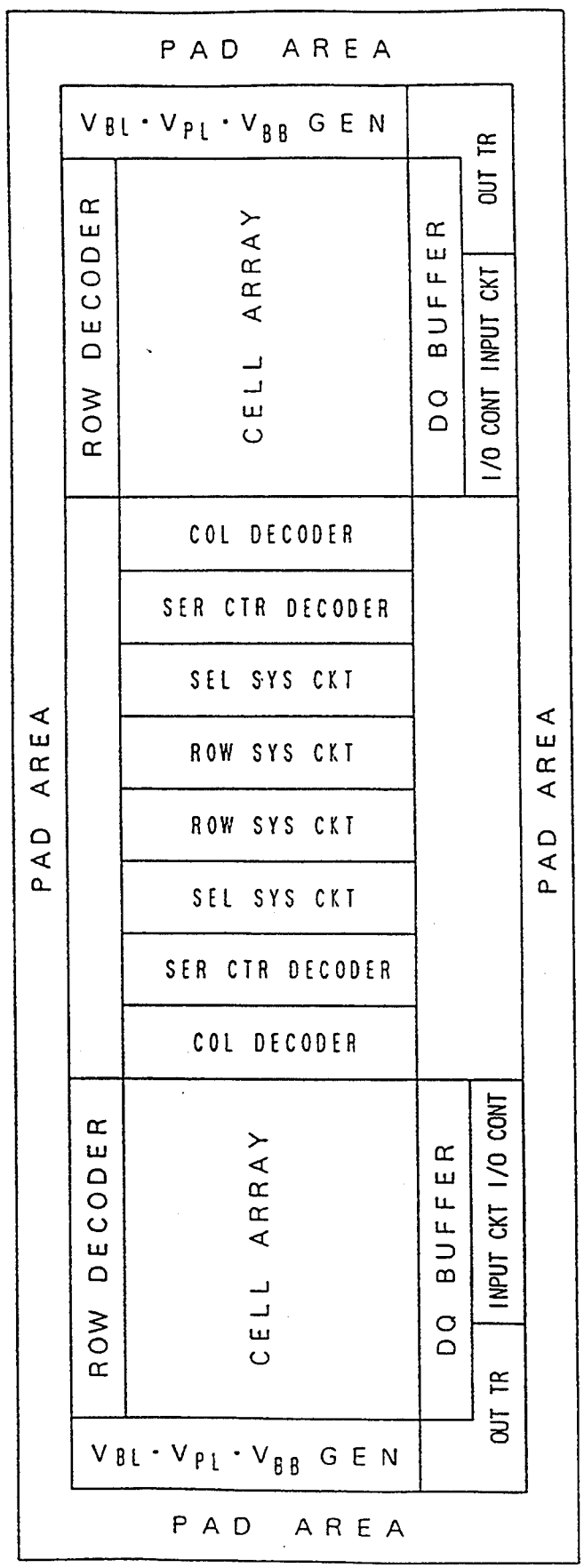
FIG. 49 is a floor map for assistance in explaining the arrangement of the respective circuit systems.

FIG. 49 is a floor map on which various circuit systems described above are arranged, in which the entire circuit arrangement is shown. The middle portion is a row system circuit group, which activates the cell arrays selectively and controls the operation for amplifying and latching the cell data on the bit lines. On both sides thereof, symmetrically interleaved serial systems are arranged. The output circuits, the input circuits and the input and output control circuits are arranged on both the side at which the I/O pins and the control pins are concentrated. Further, the DQ buffers are arranged on both sides. The bit lines, the precharge voltage generating circuit, the cell plate voltage generating circuit and the substrate voltage generating circuit are arranged on one short side of the chip. Further, the bonding pads are arranged on the outer periphery of the chip.

By arranging the various circuits as described above, it is possible to simplify the control of the serial system signals by the row system signals. This is because no special wiring is required to transmit the signals from the row system to the serial system. Further, the serial counters and the column partial decoders can be controlled by the serial system circuits without arranging special bus wiring, thus enabling a high speed operation. Further, the signals can be transmitted directly without use of any bus wiring. Therefore, the bus wiring can be eliminated and thereby the chip area can be reduced. Further, it is possible to satisfy the diversified package requirements by providing pad areas for bonding pads.

The problem involved in the high speed operation is related to noise generated at the supply voltage line and the ground line, which will deteriorate the device performance. The above-mentioned problem tends to be generated when noise is superimposed upon the voltage supply line and the ground line in different way. In more detail, when noise is superimposed upon the voltage supply line and the ground line is stable against noise at a low supply voltage, the effective voltage applied to the circuit is a voltage obtained by subtracting the noise form the supply voltage. In this case, since the circuit is to be operated by a low voltage, the operational speed is reduced.

Figure 50:
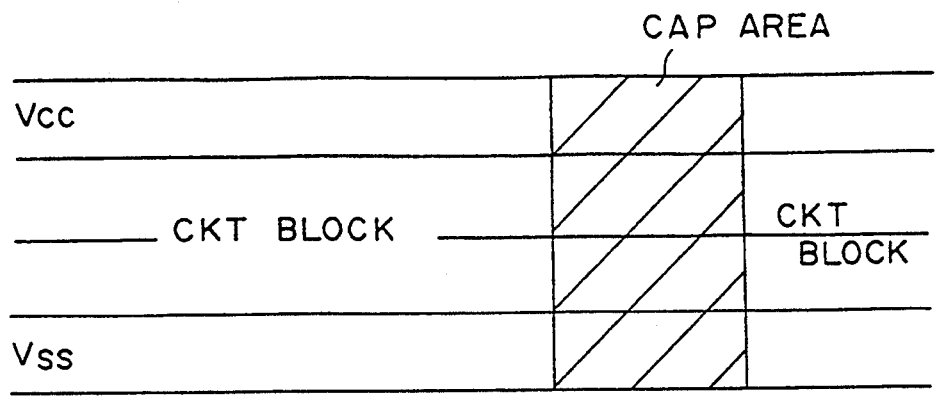
FIG. 50 is an illustration for assistance in explaining the conventional noise countermeasures.

To overcome the above-mentioned problem, conventionally a capacitor is formed between the supply voltage line and the ground line to absorb noise as shown in FIG. 50. In the conventional method, however, since an area for providing the capacitor area must be additionally provided inside the chip, the dead space in the chip increases with increasing capacitance of the capacitor, thus causing an increase in chip area.

Figure 51:
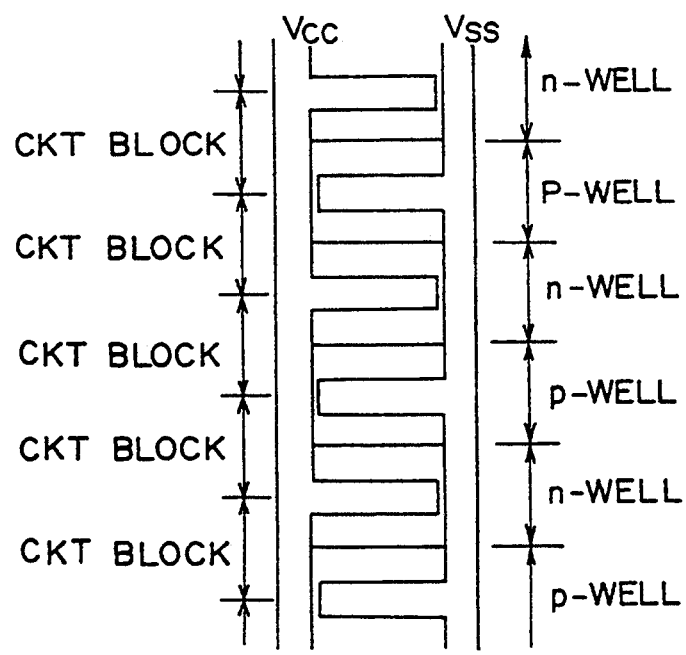
FIG. 51 is a diagram showing an arrangement of the circuit blocks for noise countermeasures according to the present invention.
Figure 52:
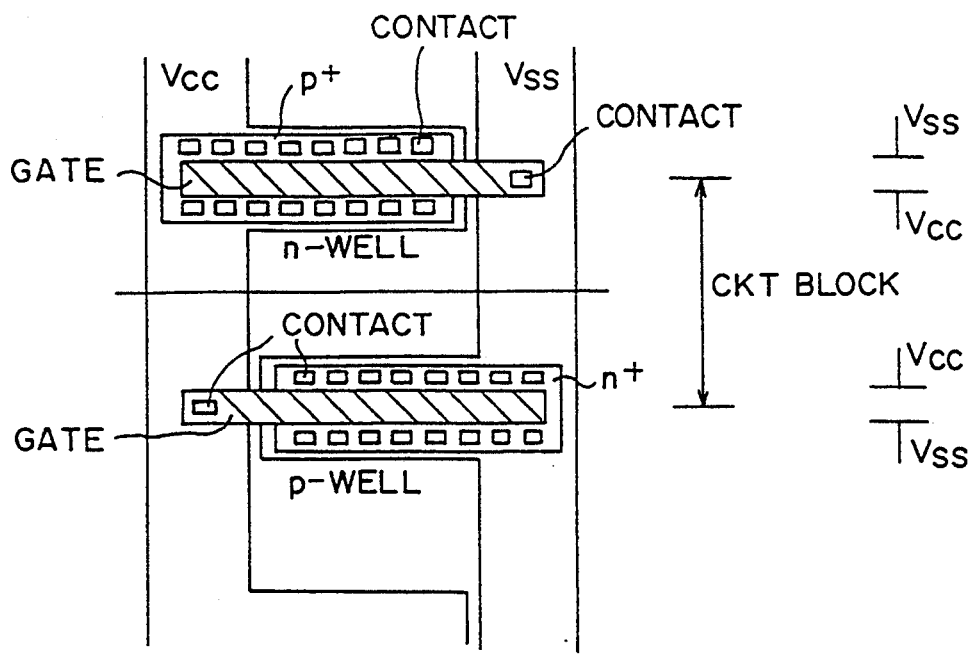
FIG. 52 is a diagram showing an arrangement of the capacitors connected between the voltage supply line Vcc and the ground line Vss.

To overcome the problem involved in the conventional noise countermeasures as described above, in the semiconductor memory device according to the present invention, the circuit blocks are arranged as shown in FIG. 51. That is, the respective middle portions of the floor map as shown in FIG. 49 are arranged as circuit blocks as shown in FIG. 51, and the supply voltage Vcc and the ground line Vss for the respective blocks are arranged as shown in FIG. 51. Further, capacitors are formed between the supply voltage line Vcc and the ground line Vss as shown in FIG. 52. In this circuit arrangement as shown in FIG. 52, it is possible to obtain capacitors formed between the supply voltage and the ground and distributed uniformly, without concentrating the capacitor in the circuit blocks and without providing an additional capacitor area.

In the semiconductor memory device according to the present invention, since the capacitors are formed in the supply voltage area and ground area, the chip area is not increased by forming the capacitors. Further, the distribution and the capacitance of the capacitors can be adjusted easily by cutting off one electrode of the capacitor and further shorting the other electrode thereof.

As described above, the operation and mode of the embodiment of the present invention can be summarized as follows:

(I) The semiconductor memory device is provided with the control signal group, the address signal group and the input and output signal group. The first address signal group (RA) is acquired after the second control signal (CE) is changed in the active direction and further after first control signal (CLK) is changed in the active direction. The second address signal group (CA) and the fourth control signal (R/W) are acquired after the third control signal (RWL) is changed in the active direction and further the first control signal (CLK) is changed to the active direction. The access operation begins from the second address signal group (CE). The read and write modes are set on the basis of the fourth control signal (R/W). Whenever the first control signal (CLK) changes in the active direction, the read or write is effected in sequence from the second address signal group (CA) in accordance with the status of the fourth control signal (R/W). When the fifth control signal (CM) changes to the active direction and further the first control signal (CLK) changes to the active direction, the output status is set to a high impedance status in the read mode, and the input of the data write is disabled in the write mode. As long as the fifth control signal (CM) is kept in the active status, the high impedance status is kept and the input of the data write is kept disabled. Further, while the fifth control signal (CM) is in the active status, the address is not changed successively. Further, when the sixth control signal (NBM, NOE, NRFSH) changes to the first status in the read mode, the output status is obtained and further kept in this status, as long as the sixth control signal is in the first status. When the sixth control signal changes to the second status, the output status is changed to the high impedance status and further kept therein, as long as the sixth control signal is in the second status. In the write mode, the sixth control signal changes to the first status. As long as this status is kept, the written data are disabled; that is, no writing operation is effected. When the sixth control signal changes to the second status, the writing operation is kept enabled.

(1) After the second control signal has been changed in the non-active direction and further after the first control signal is changed in the active direction by a predetermined number of times, the precharge starts.

(2) After the second control signal has been changed in the non-active direction and further a predetermined time duration has elapsed, when the sixth control signal is changed to the first status, the address of the internal address counter output is refreshed. The internal address counter changes in sequence in accordance with the change-over between the first and second statuses of the sixth control signal. The refresh can be achieved in sequence in accordance with the change in the internal address counter.

(3) The internal circuit operation is interleaved by use of the least significant address of the second address signal group. The interleaved circuit operation is further processed under pipeline control.
  a) Here, in the write operation mode, the entire writing operation is divided into a plurality of cycles.
  b) Here, in the write operation, data is acquired in the first cycle, and the written data is outputted to the first data line connected to the data acquiring circuit. In the second cycle after the first cycle, the write data outputted to the first data line is written in the cell array.
  c) Here, in the write operation, the sixth control signal is processed in the same way as with the case of the write data. The acquired sixth control signal is written in the data line for the sixth control signal arranged so as to correspond to the number of the divided cycles, through the interleave and pipeline operation. When the date obtained by acquiring the sixth control signal corresponds to the second status, the write data is written.
  d) When the head address of the serial cycle is set, the data input path of the data acquiring circuit connected to the first data line corresponding to the head address is turned on. In the first cycle after the head address has been set, the turned on path corresponding to the head address is closed. The data input path corresponding to the second address next to the head address is turned on to output data already acquired in the first data line corresponding to the head address.

(II) In the semiconductor memory device, at least two column select lines are connected from the same column select line block to the physically same columns.

(III) After the cycle in which the tap address is set and before the effective data is inputted, the dummy cycle is inputted. Further, a plurality of data lines decoded by the address are provided. The data lines are selected in sequence for each cycle. The data is outputted to the output circuit. The semiconductor memory device as described above is provided with the data lines changed to the select status when the tap address is set, in such a way that the data line corresponding to the tap address can be selected after the dummy cycle.

(IV) The circuit operation is interleaved by the least significant bit of the address, and further the serial address counter is provided. In the semiconductor memory device, the address except the least significant bit of the tap address is set to the first and second address counters operated in the interleaved mode. The first and second address counters are operated by the first and second counter control signals. The first address counter corresponds to the odd number, and the second address counter corresponds to the even number. Once the tap address is set, the address counter operation is disabled. In this case, upon activation of the second counter control signal, the first counter operation is enabled. Thereafter, upon activation of the first counter, the second counter operation is enabled.

(V) The semiconductor memory device is provided with at least first and second supply voltage lines. The first and second supply voltage lines of the first and second primary supply voltages are arranged in parallel with each other. Further, the secondary supply voltages extending from the respective primary supply voltages are arranged alternately. Capacitance is formed between the primary and secondary supply voltages.

As described above, in the semiconductor memory device according to the present invention, since the memory device can be controlled by a signal clock for controlling the CPU, no additional clock for controlling the memory device is required. Therefore, it is possible not only to simplify the configuration of the peripheral circuits of the memory device but also to realize a memory device of a high speed access time, thus allowing the semiconductor memory device to cope with a high speed CPU.

What is claimed is:
1. A semiconductor memory device, comprising:
  memory cell arrays divided into at least two banks with respect to a column system;

row address designating means for designating a row address to each of said banks;

column address designating means for designating a column address to each of said banks in serial order;

a plurality of input and output buffers for holding input and output data to and from each of said banks;

address control means for applying a group of inputted address signals to said row address designating means and said column address designating means and for interleaving said memory cell arrays in operation, on the basis of an inputted standard signal and a group of control signals; and input and output control means for operating said input and output buffers in a pipelined process in accordance with the operation of said address control means, said standard signal being used for operations of said address control means and said input and output control means, said input and output control means, and said memory cells arrays being operated on the basis of the standard signal, wherein in a write mode, data are acquired from the outside in a cycle and then the acquired data are written in said input and output buffers in the succeeding cycle, and wherein when an output enable signal of the control signal group is used as a mask signal in the write mode, a H/L level of the output enable signal is acquired by said input and output control means as data.

2. A semiconductor memory device, comprising:

memory cell arrays divided into at least two banks with respect to a column system;

row address designating means for designating a row address to each of said banks;

column address designating means for designating a column address to each of said banks in serial order;

a plurality of input and output buffers for holding input and output data to and from each of said banks;

address control means for applying a group of inputted address signals to said row address designating means and said column address designating means and for interleaving said memory cell arrays in operation, on the basis of an inputted standard signal and a group of control signals; and input and output control means for operating said input and output buffers in a pipelined process in accordance with the operation of said address control means, said standard signal being used for operations of said address control means and said input and output control means, said input and output control means, and said memory cells arrays being operated on the basis of the standard signal, wherein in a read mode, data are read from said memory cell arrays in a cycle and then the read data are acquired by said input and output buffers, respectively in the succeeding cycle, to output the acquired data to the outside, wherein in a write mode, data are acquired from the outside in a cycle and then the acquired data are written in said input and output buffers in the succeeding cycle, and wherein when an output enable signal of the group of control signals is used as a mask signal in the write mode, a H/L level of the output enable signal is acquired by said input and output control means as data.

3. The semiconductor memory device of claim 1, wherein said row address designating means, column address designating means, address control means, input and output control means, are operated by a high supply voltage connected to a first supply voltage line and a low supply voltage connected to a second supply voltage line, and the first and second supply voltage lines are formed into a comb-shape, respectively and arranged in such a way that the comb-shaped portions thereof are engaged with respect to each other.

4. The semiconductor memory device of claim 2, wherein said row address designating means, column address designating means, address control means, input and output control means, are operated by a high supply voltage connected to a first supply voltage line and a low supply voltage connected to a second supply voltage line, and the first and second supply voltage lines are formed into a comb-shape, respectively and arranged in such a way that the comb-shaped portions thereof are engaged with respect to each other.

5. A semiconductor memory device, which comprises:

memory cell array divided into at least two banks with respect to column system;

row address designating means for designating a row address to each of said banks;

column address designating means for designating a column address to each of said banks in serial order;

a plurality of input and output buffers for holding input and output signals to and from each of said memory cell arrays;

address control means for applying first and second address signals to said row address designating means and said column address designating means, on the basis of first to sixth control signals, respectively; and input and output control means for operating said input and output buffers in accordance with the operation of said address control means; and wherein:

when the first control signal changes in an active direction after the second control signal has been changed in an active direction, the first address signal is acquired;

said first control signal is used for operations of said address control means and said input and output control means, and when the first control signal changes in an active direction after the third control signal has been changed in an active direction, the second address signal and the fourth control signal are acquired; and access begins from the second address signal;

either of read or write mode is determined on the basis of a status of the fourth control signal;

whenever the first control signal changes in the active direction, data are read or written in sequence on the basis of the second address signal and in accordance with the status of the fourth control signal;

when the first control signal changes in an active direction after the fifth control signal has been changed in an active direction, in the read mode the output is kept at a high impedance status, and in the write mode the input is kept disabled with respect to data write;

while the fifth control signal is in the active status, the high impedance status of the output and the disabled status of the input are both maintained;

further, when said fifth control signal is in the active status, no sequential address change is effected;

further, when the sixth control signal changes to a first status, the data output status begins, and while the sixth control signal is kept at the first status, the data output status is maintained;

when the sixth control signal changes to a second status, the data output status is set to the high impedance status, and while the sixth control signal is kept at the second status, the high impedance status is maintained;

in write mode, when the sixth control signal changes to the first status and further as long as this status is kept, the written data are unavailable without writing data;

when the sixth control signal changes to the second status and further as long as this status is kept, the data write is kept enabled; and control is executed in such a way that said address control means, said input and output control means, and said memory cell arrays can be all operated on the basis of the first control signal.

6. The semiconductor memory device of claim 5, wherein after the second control signal changes in the active direction and further the first control signal changes to the active direction by the number of predetermined times, data lines are so controlled as to be precharged.

7. The semiconductor memory device of claim 5, wherein when the sixth control signal is changed to the first status a predetermined time after the second control signal has been changed to a non-active direction, the address is refreshed in accordance with an output of an internal address counter, and the output of the internal counter changes in sequence in accordance with switching operation of the sixth control signal between the first status and the second status to refresh the address in sequence.

8. The semiconductor memory device of claim 5, wherein internal circuit operation is interleaved on the basis of the least significant bit of the second address signal, and the interleaved operation is further controlled in pipeline processing.

9. The semiconductor memory device of claim 8, wherein in the write mode, entire write operation is executed in a plurality of divided cycles.

10. The semiconductor memory device of claim 9, wherein in the first cycle of the write mode, write data are acquired by data acquiring circuits and further the acquired data are outputted to first data lines connected to the data acquiring circuits; and in the second cycle, the write data outputted on the first data lines are written in the cell arrays.

11. The semiconductor memory device of claim 8, wherein in the write mode, the sixth control signal is processed in the same way as data, in such a way that the acquired sixth control signal is written in data lines provided for the sixth control signal so as to correspond to the number of cycles divided in accordance with the interleave and pipeline processing; and the data write operation is executed when the sixth control signal acquired as data is at the second status.

12. The semiconductor memory device of claim 5, wherein at least two column select lines are connected from a same column select line block to a physically same column.

13. The semiconductor memory device of claim 8, wherein when a head address of a serial cycle is set, a data input path of a data acquiring circuit connected to a first data line corresponding to the head address is turned on; in the first cycle after the head address has been set, the turned-on path corresponding to the head address is turned off; and a data input path corresponding to the succeeding address after the head address is turned on, and further the data acquired in the first data line corresponding to the head address is outputted.

14. The semiconductor memory device of claim 5, wherein after a cycle during which a tap address is set and before data are outputted effectively, a dummy cycle is inserted and further a plurality of data lines decoded by the address are provided and selected in sequence for each cycle, the data are outputted from output circuits; and the data lines to be selected when the tap address is set are so determined that after the dummy cycle, the data lines of the tap address can be selected.

15. The semiconductor memory device of claim 5, wherein circuit operation is interleaved by the least significant bit of the address; serial address counters are provided; the address bits except the least significant bit of the tap address are set to the first address counter and the second address counter both interleaved with each other; a first counter control signal for operating the first address counter and a second counter control signal for operating the second address counter are provided; the first counter corresponds to even bit numbers and the second counter corresponds to odd bit numbers respectively; when the tap address is set, the address counters are disabled in operation; upon activation of the second counter control signal, operation of the first counter is enabled; and thereafter upon operation of the first counter, operation of the second counter is enabled.

16. The semiconductor memory device of claim 5, wherein there are provided at least first supply voltage line and a second supply voltage line; a main supply voltage section of the first supply voltage line and a main supply voltage section of the second supply voltage line are arranged in parallel to each other; and sub-supply voltage sections extending from the first and second supply voltage sections, respectively are arranged so as to be engaged with each other.

17. The semiconductor memory device of claim 16, wherein a capacitance is formed between the two sub-supply voltage sections, respectively.

18. The semiconductor memory device of claim 1, wherein said standard signal is CLK signal and said control signals are CE, RWL, R/W, CM and /OE signals.

19. The semiconductor memory device of claim 5, wherein said first to sixth control signals are CLK, CE, RWL, R/W, CM and /OE signals.

20. A semiconductor memory device, which comprises:
  memory cell array divided into at least two banks with respect to column system;
  row address designating means for designating a row address to each of said banks;

column address designating means for designating a column address to each of said banks in serial order;

a plurality of input and output buffers for holding input and output signals to and from each of said memory cell arrays;

address control means for applying first and second address signals to said row address designating means and said column address designating means, on the basis of first to fifth control signals, respectively; and input and output control means for operating said input and output buffers in accordance with the operation of said address control means; and wherein:

when the first control signal changes in an active direction after the second control signal has been changed in an active direction, the first address signal is acquired;

said first control signal is used for operations of said address control means and said input and output control means, when the first control signal changes in an active direction after the third control signal has been changed in an active direction, the second address signal and the fourth control signal are acquired; and access begins from the second address signal; and when either of read or write mode is determined on the basis of a status of the fourth control signal; and whenever the first control signal changes in the active direction, data are read or written in sequence on the basis of the second address signal and in accordance with the status of the fourth control signal; and when the fifth control signal changes to a first status, the data output status begins, and while the fifth control signal is kept at the first status, the data output status is maintained; and when the fifth control signal changes to a second status, the data output status is set to the high impedance status, and while the fifth control signal is kept at the second status, the high impedance status is maintained;

in write mode, when the fifth control signal changes to the first status and further as long as this status is kept, the written data are unavailable without writing data;

when the fifth control signal changes to the second status and further as long as this status is kept, the data write is kept enabled; and control is executed in such a way that said address control means, said input and output control means, and said memory cell arrays can be all operated on the basis of the first control signal.

21. The semiconductor memory device of claim 20, wherein after the second control signal changes in the active direction and further the first control signal changes to the active direction by the number of predetermined times, data lines are so controlled as to be precharged.

22. The semiconductor memory device of claim 20, wherein when the fifth control signal is changed to the first status a predetermined time after the second control signal has been changed to a non-active direction, the address is refreshed in accordance with an output of an internal address counter, and the output of the internal counter changes in sequence in accordance with switching operation of the fifth control signal between the first status and the second status to refresh the address in sequence.

23. The semiconductor memory device of claim 20, wherein internal circuit operation is interleaved on the basis of the least significant bit of the second address signal, and the interleaved operation is further controlled in pipeline processing.

24. The semiconductor memory device of claim 23, wherein in the write mode, entire write operation is executed in a plurality of divided cycles.

25. The semiconductor memory device of claim 24, wherein in the first cycle of the write mode, write data are acquired by data acquiring circuits and further the acquired data are outputted to first data lines connected to the data acquiring circuits; and in the second cycle, the write data outputted on the first data lines are written in the cell arrays.

26. The semiconductor memory device of claim 23, wherein in the write mode, the fifth control signal is processed in the same way as data, in such a way that the acquired fifth control signal is written in data lines provided for the fifth control signal so as to correspond to the number of cycles divided in accordance with the interleave and pipeline processing; and the data write operation is executed when the fifth control signal acquired as data is at the second status.

27. The semiconductor memory device of claim 20, wherein at least two column select lines are connected from a same column select line block to a physically same column.

28. The semiconductor memory device of claim 23, wherein when a head address of a serial cycle is set, a data input path of a data acquiring circuit connected to a first data line corresponding to the head address is turned on; in the first cycle after the head address has been set, the turned-on path corresponding to the head address is turned off; and a data input path corresponding to the succeeding address after the head address is turned on, and further the data acquired in the first data line corresponding to the head address is outputted.

29. The semiconductor memory device of claim 20, wherein after a cycle during which a tap address is set and before data are outputted effectively a dummy cycle is inserted and further a plurality of data lines decoded by the address are provided and selected in sequence for each cycle, the data are outputted from output circuits; and the data lines to be selected when the tap address is set are so determined that after the dummy cycle, the data lines of the tap address can be selected.

30. The semiconductor memory device of claim 20, wherein circuit operation is interleaved by the least significant bit of the address; serial address counters are provided; the address bits except the least significant bit of the tap address are set to the first address counter and the second address counter both interleaved with each other; a first counter control signal for operating the first address counter and a second counter control signal for operating the second address counter are provided; the first counter corresponds to even bit numbers and the second counter corresponds to odd bit numbers respectively; when the tap address is set, the address counters are disabled in operation; upon activation of the second counter control signal, operation of the first counter is enabled; and thereafter upon operation of the first counter, operation of the second counter is enabled.

31. The semiconductor memory device of claim 20, wherein there are provided at least first supply voltage line and a second supply voltage line; a main supply voltage section of the first supply voltage line and a main supply voltage section of the second supply voltage line are arranged in parallel to each other; and sub-supply voltage sections extending from the first and second supply voltage sections, respectively are arranged so as to be engaged with each other.

32. The semiconductor memory device of claim 31, wherein a capacitance is formed between the two sub-supply voltage sections, respectively.

33. The semiconductor device of claim 20, wherein said first to fifth control signals are clock signal (CLK), chip enable signal (CE), read write latch signal (RWL), read/write status signal (R/W), and inverted output enable signal (/OE), respectively.

* * * * *